(12) United States Patent
Pasquale et al.

(10) Patent No.: US 10,192,742 B2
(45) Date of Patent: *Jan. 29, 2019

(54) SOFT LANDING NANOLAMINATES FOR ADVANCED PATTERNING

(71) Applicant: Novellus Systems, Inc., Fremont, CA (US)

(72) Inventors: Frank L. Pasquale, Beaverton, OR (US); Shankar Swaminathan, Beaverton, OR (US); Adrien LaVoie, Newberg, OR (US); Nader Shamma, Cupertino, CA (US); Girish A. Dixit, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/874,766

(22) Filed: Jan. 18, 2018

(65) Prior Publication Data

US 2018/0158683 A1    Jun. 7, 2018

Related U.S. Application Data

(60) Continuation of application No. 15/177,108, filed on Jun. 8, 2016, now Pat. No. 9,905,423, which is a
(Continued)

(51) Int. Cl.
*H01L 21/31* (2006.01)
*H01L 21/033* (2006.01)
(Continued)

(52) U.S. Cl.
CPC ........ *H01L 21/0337* (2013.01); *C23C 16/345* (2013.01); *C23C 16/401* (2013.01);
(Continued)

(58) Field of Classification Search
CPC .......... H01L 21/02164; H01L 21/0217; H01L 21/02186; H01L 21/02219;
(Continued)

(56) References Cited

U.S. PATENT DOCUMENTS 4,492,620 A    1/1985  Matsuo et al.
4,500,563 A    2/1985  Ellenberger et al.
(Continued)

FOREIGN PATENT DOCUMENTS

CN    1691352 A    11/2005
CN    1906327 A    1/2007
(Continued)

OTHER PUBLICATIONS

U.S. Notice of Allowance, dated Jul. 31, 2002, issued in U.S. Appl. No. 09/862,539.
(Continued)

*Primary Examiner* — Brook Kebede
(74) *Attorney, Agent, or Firm* — Weaver Austin Villeneuve & Sampson LLP

(57) ABSTRACT

Methods for depositing nanolaminate protective layers over a core layer to enable deposition of high quality conformal films over the core layer for use in advanced multiple patterning schemes are provided. In certain embodiments, the methods involve depositing a thin silicon oxide or titanium oxide film using plasma-based atomic layer deposition techniques with a low high frequency radio frequency (HFRF) plasma power, followed by depositing a conformal titanium oxide film or spacer with a high HFRF plasma power.

20 Claims, 13 Drawing Sheets

Related U.S. Application Data division of application No. 14/194,324, filed on Feb. 28, 2014, now Pat. No. 9,390,909, which is a continuation-in-part of application No. 14/074,617, filed on Nov. 7, 2013, now Pat. No. 9,287,113.

(51) Int. Cl.

| | | |
|---|---|---|
| *H01L 21/02* | (2006.01) | |
| *C23C 16/34* | (2006.01) | |
| *C23C 16/40* | (2006.01) | |
| *C23C 16/455* | (2006.01) | |
| *H01L 21/66* | (2006.01) | |
| *C23C 16/505* | (2006.01) | |
| *C23C 16/56* | (2006.01) | |
| *H01L 21/027* | (2006.01) | |
| *H01L 21/311* | (2006.01) | |

(52) U.S. Cl.
CPC .......... *C23C 16/402* (2013.01); *C23C 16/405* (2013.01); *C23C 16/4554* (2013.01); *C23C 16/45542* (2013.01); *C23C 16/505* (2013.01); *C23C 16/56* (2013.01); *H01L 21/0217* (2013.01); *H01L 21/0228* (2013.01); *H01L 21/0273* (2013.01); *H01L 21/02164* (2013.01); *H01L 21/02186* (2013.01); *H01L 21/02219* (2013.01); *H01L 21/02274* (2013.01); *H01L 21/0332* (2013.01); *H01L 21/31144* (2013.01); *H01L 22/12* (2013.01); *H01L 22/20* (2013.01)

(58) Field of Classification Search
CPC ........... H01L 21/02274; H01L 21/0228; H01L 21/0273; H01L 21/0332; H01L 21/0337; H01L 21/31144; H01L 22/12; H01L 22/20
USPC .......................... 438/703, 758, 770, 773, 785
See application file for complete search history.

(56) References Cited

U.S. PATENT DOCUMENTS

| | | | |
|---|---|---|---|
| 4,609,903 A | 9/1986 | Toyokura et al. |
| 5,139,825 A | 8/1992 | Gordon et al. |
| 5,194,398 A | 3/1993 | Miyachi et al. |
| 5,223,443 A | 6/1993 | Chinn et al. |
| 5,496,608 A | 3/1996 | Matsuda et al. |
| 5,593,914 A | 1/1997 | Evans, Jr. et al. |
| 5,670,432 A | 9/1997 | Tsai |
| 5,700,519 A | 12/1997 | Lam |
| 5,856,003 A | 1/1999 | Chiu |
| 5,874,368 A | 2/1999 | Laxman et al. |
| 5,932,286 A | 8/1999 | Beinglass et al. |
| 5,961,791 A | 10/1999 | Frisa et al. |
| 5,962,923 A | 10/1999 | Xu et al. |
| 6,045,666 A | 4/2000 | Satitpunwaycha et al. |
| 6,054,382 A | 4/2000 | Hsu et al. |
| 6,090,709 A | 7/2000 | Kaloyeros et al. |
| 6,093,966 A | 7/2000 | Venkatraman et al. |
| 6,140,223 A | 10/2000 | Kim et al. |
| 6,191,033 B1 | 2/2001 | Liao et al. |
| 6,217,721 B1 | 4/2001 | Xu et al. |
| 6,235,163 B1 | 5/2001 | Angelo et al. |
| 6,270,572 B1 | 8/2001 | Kim et al. |
| 6,271,591 B1 | 8/2001 | Dubin et al. |
| 6,333,547 B1 | 12/2001 | Tanaka et al. |
| 6,337,151 B1 | 1/2002 | Uzoh et al. |
| 6,342,448 B1 | 1/2002 | Lin et al. |
| 6,346,741 B1 | 2/2002 | Van Buskirk et al. |
| 6,350,688 B1 | 2/2002 | Liu et al. |
| 6,391,803 B1 | 5/2002 | Kim et al. |
| 6,416,822 B1 | 7/2002 | Chiang et al. |
| 6,428,859 B1 | 8/2002 | Chiang et al. |
| 6,468,924 B2 | 10/2002 | Lee et al. |
| 6,509,601 B1 | 1/2003 | Lee et al. |
| 6,528,430 B2 | 3/2003 | Kwan et al. |
| 6,541,374 B1 | 4/2003 | de Felipe et al. |
| 6,551,893 B1 | 4/2003 | Zheng et al. |
| 6,566,246 B1 | 5/2003 | de Felipe et al. |
| 6,569,783 B2 | 5/2003 | Uzoh et al. |
| 6,576,053 B1 | 6/2003 | Kim et al. |
| 6,632,478 B2 | 10/2003 | Gaillard et al. |
| 6,645,574 B1 | 11/2003 | Lee et al. |
| 6,689,220 B1 | 2/2004 | Nguyen |
| 6,723,595 B2 | 4/2004 | Park |
| 6,730,614 B1 | 5/2004 | Lim et al. |
| 6,743,738 B2 | 6/2004 | Todd |
| 6,756,318 B2 | 6/2004 | Nguyen et al. |
| 6,765,303 B1 | 7/2004 | Krivokapic |
| 6,809,421 B1 | 10/2004 | Hayasaka et al. |
| 6,828,218 B2 | 12/2004 | Kim et al. |
| 6,835,417 B2 | 12/2004 | Saenger et al. |
| 6,841,044 B1 | 1/2005 | Ruzic |
| 6,861,356 B2 | 3/2005 | Matsuse et al. |
| 6,884,466 B2 | 4/2005 | Kaloyeros et al. |
| 6,930,058 B2 | 8/2005 | Hill et al. |
| 6,930,060 B2 | 8/2005 | Chou et al. |
| 6,943,092 B2 | 9/2005 | Kim et al. |
| 6,962,876 B2 | 11/2005 | Ahn et al. |
| 6,967,154 B2 | 11/2005 | Meng et al. |
| 6,987,240 B2 | 1/2006 | Jennings et al. |
| 6,995,471 B2 | 2/2006 | Shue et al. |
| 7,001,844 B2 | 2/2006 | Chakravarti et al. |
| 7,041,335 B2 | 5/2006 | Chung |
| 7,041,595 B2 | 5/2006 | Chopra |
| 7,077,904 B2 | 7/2006 | Cho et al. |
| 7,081,271 B2 | 7/2006 | Chung et al. |
| 7,109,129 B1 | 9/2006 | Papasouliotis |
| 7,115,528 B2 | 10/2006 | Vaartstra et al. |
| 7,122,222 B2 | 10/2006 | Xiao et al. |
| 7,122,464 B2 | 10/2006 | Vaarstra |
| 7,125,815 B2 | 10/2006 | Vaartstra |
| 7,132,353 B1 | 11/2006 | Xia et al. |
| 7,141,278 B2 | 11/2006 | Koh et al. |
| 7,148,155 B1 | 12/2006 | Tarafdar et al. |
| 7,151,039 B2 | 12/2006 | Lee et al. |
| 7,172,792 B2 | 2/2007 | Wang et al. |
| 7,176,084 B2 | 2/2007 | Lee et al. |
| 7,205,187 B2 | 4/2007 | Leith et al. |
| 7,223,649 B2 | 5/2007 | Oh et al. |
| 7,241,686 B2 | 7/2007 | Marcadal et al. |
| 7,244,668 B2 | 7/2007 | Kim |
| 7,250,083 B2 | 7/2007 | Sneh |
| 7,259,050 B2 | 8/2007 | Chen et al. |
| 7,261,919 B2 | 8/2007 | Mehregany et al. |
| 7,294,582 B2 | 11/2007 | Haverkort et al. |
| 7,297,641 B2 | 11/2007 | Todd et al. |
| 7,300,885 B2 | 11/2007 | Hasebe et al. |
| 7,314,835 B2 | 1/2008 | Ishizaka et al. |
| 7,341,959 B2 | 3/2008 | Brcka |
| 7,351,668 B2 | 4/2008 | Chou et al. |
| 7,361,538 B2 | 4/2008 | Luan et al. |
| 7,361,611 B2 | 4/2008 | Chakravarti et al. |
| 7,390,743 B2 | 6/2008 | Shin |
| 7,393,561 B2 | 7/2008 | Paranjpe |
| 7,399,388 B2 | 7/2008 | Moghadam et al. |
| 7,419,888 B2 | 9/2008 | Yang et al. |
| 7,435,454 B2 | 10/2008 | Brcka |
| 7,435,684 B1 | 10/2008 | Lang et al. |
| 7,462,571 B2 | 12/2008 | Hasebe et al. |
| 7,473,638 B2 | 1/2009 | Yang et al. |
| 7,482,247 B1 | 1/2009 | Papasouliotis et al. |
| 7,488,694 B2 | 2/2009 | Kim et al. |
| 7,507,676 B2 | 3/2009 | Chou et al. |
| 7,510,984 B2 | 3/2009 | Saito et al. |
| 7,521,331 B2 | 4/2009 | Park et al. |
| 7,524,762 B2 | 4/2009 | Marcadal et al. |
| 7,544,615 B2 | 6/2009 | Vaartstra |
| 7,572,052 B2 | 8/2009 | Ravi et al. |
| 7,592,231 B2 | 9/2009 | Cheng et al. |
| 7,595,010 B2 | 9/2009 | Chakravarti et al. |
| 7,601,648 B2 | 10/2009 | Chua et al. |
| 7,615,438 B2 | 11/2009 | Ahn et al. |

(56) References Cited

U.S. PATENT DOCUMENTS

| | | |
|---|---|---|
| 7,615,449 B2 | 11/2009 | Chung et al. |
| 7,622,369 B1 | 11/2009 | Lee et al. |
| 7,622,383 B2 | 11/2009 | Kim et al. |
| 7,629,267 B2 | 12/2009 | Wan et al. |
| 7,632,757 B2 | 12/2009 | Matsuura |
| 7,633,125 B2 | 12/2009 | Lu et al. |
| 7,638,170 B2 | 12/2009 | Li |
| 7,645,484 B2 | 1/2010 | Ishizaka |
| 7,651,729 B2 | 1/2010 | Kim et al. |
| 7,651,730 B2 | 1/2010 | Hasebe |
| 7,651,953 B2 | 1/2010 | Todd et al. |
| 7,651,959 B2 | 1/2010 | Fukazawa et al. |
| 7,670,646 B2 | 3/2010 | Ahn et al. |
| 7,682,657 B2 | 3/2010 | Sherman |
| 7,687,409 B2 | 3/2010 | Ahn et al. |
| 7,713,592 B2 | 5/2010 | Nguyen et al. |
| 7,727,882 B1 | 6/2010 | Wu et al. |
| 7,758,920 B2 | 7/2010 | Hasebe et al. |
| 7,776,733 B2 | 8/2010 | Hasegawa |
| 7,825,039 B2 | 11/2010 | Takahashi et al. |
| 7,906,168 B2 | 3/2011 | Hasebe et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,101,531 B1 | 1/2012 | Li et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,456,007 B2 | 6/2013 | Sandhu et al. |
| 8,524,612 B2 | 9/2013 | Li et al. |
| 8,592,328 B2 | 11/2013 | Hausmann et al. |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,728,956 B2 | 5/2014 | LaVoie et al. |
| 8,956,983 B2 | 2/2015 | Swaminathan et al. |
| 8,999,859 B2 | 4/2015 | Swaminathan et al. |
| 9,076,646 B2 | 7/2015 | Sims et al. |
| 9,214,334 B2 | 12/2015 | Swaminathan et al. |
| 9,230,800 B2 | 1/2016 | LaVoie et al. |
| 9,257,274 B2 | 2/2016 | Kang et al. |
| 9,287,113 B2 | 3/2016 | Kang et al. |
| 9,390,909 B2* | 7/2016 | Pasquale ........... H01L 21/02274 |
| 9,478,411 B2 | 10/2016 | Thombare et al. |
| 9,478,438 B2 | 10/2016 | Thombare et al. |
| 9,905,423 B2* | 2/2018 | Pasquale ............ H01L 21/0337 |
| 2001/0039113 A1 | 11/2001 | Blalock et al. |
| 2001/0054769 A1 | 12/2001 | Raajimakers et al. |
| 2002/0076507 A1 | 6/2002 | Chiang et al. |
| 2003/0008070 A1 | 1/2003 | Seutter et al. |
| 2003/0024477 A1 | 2/2003 | Okuda et al. |
| 2003/0200917 A1 | 10/2003 | Vaartstra |
| 2004/0033698 A1 | 2/2004 | Lee et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0212041 A1 | 10/2004 | Takamatsu et al. |
| 2004/0219746 A1 | 11/2004 | Vaartstra et al. |
| 2004/0231799 A1 | 11/2004 | Lee et al. |
| 2005/0042865 A1 | 2/2005 | Cabral et al. |
| 2005/0079661 A1 | 4/2005 | Cho |
| 2005/0085070 A1 | 4/2005 | Park |
| 2005/0109276 A1 | 5/2005 | Iyer et al. |
| 2005/0118837 A1 | 6/2005 | Todd et al. |
| 2005/0159017 A1 | 7/2005 | Kim et al. |
| 2005/0181535 A1 | 8/2005 | Yun et al. |
| 2005/0186793 A1 | 8/2005 | Omoto et al. |
| 2005/0196977 A1 | 9/2005 | Saito et al. |
| 2005/0233553 A1 | 10/2005 | Kountz et al. |
| 2005/0236652 A1 | 10/2005 | Kijima et al. |
| 2005/0255700 A1 | 11/2005 | Gopalraja et al. |
| 2005/0260347 A1 | 11/2005 | Narwankar et al. |
| 2005/0276099 A1 | 12/2005 | Horng et al. |
| 2005/0287775 A1 | 12/2005 | Hasebe et al. |
| 2006/0030148 A1 | 2/2006 | Seutter et al. |
| 2006/0043504 A1 | 3/2006 | Ahn et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0213438 A1 | 9/2006 | Ishizaka et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0004186 A1 | 1/2007 | Yoshii et al. |
| 2007/0007635 A1* | 1/2007 | Forbes .............. H01L 21/28079 257/678 |
| 2007/0010071 A1 | 1/2007 | Matsuura |
| 2007/0018214 A1 | 1/2007 | Ahn et al. |
| 2007/0020922 A1 | 1/2007 | Chiang et al. |
| 2007/0065576 A1 | 3/2007 | Singh et al. |
| 2007/0134942 A1 | 6/2007 | Ahn et al. |
| 2007/0137572 A1 | 6/2007 | Matsuura et al. |
| 2007/0167028 A1 | 7/2007 | Chou et al. |
| 2007/0193982 A1 | 8/2007 | Brown et al. |
| 2007/0200243 A1 | 8/2007 | Kraus et al. |
| 2007/0215036 A1 | 9/2007 | Park et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0251444 A1 | 11/2007 | Gros-Jean et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0087890 A1 | 4/2008 | Ahn et al. |
| 2008/0123394 A1 | 5/2008 | Lee et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274299 A1 | 11/2008 | Chen et al. |
| 2008/0274302 A1 | 11/2008 | Hasebe et al. |
| 2008/0299765 A1 | 12/2008 | Besling |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0183994 A1 | 7/2009 | Misra et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2009/0305506 A1 | 12/2009 | Linz |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0099236 A1 | 4/2010 | Kwon et al. |
| 2010/0102417 A1 | 4/2010 | Ganguli et al. |
| 2010/0124621 A1 | 5/2010 | Kobayashi et al. |

(56) References Cited

U.S. PATENT DOCUMENTS

| | | |
|---|---|---|
| 2010/0136260 A1 | 6/2010 | Matsunaga et al. |
| 2010/0136313 A1 | 6/2010 | Shimizu et al. |
| 2010/0167555 A1 | 7/2010 | Maula et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0064969 A1 | 3/2011 | Chen et al. |
| 2011/0076850 A1 | 3/2011 | Sumioka |
| 2011/0086516 A1 | 4/2011 | Lee et al. |
| 2011/0120943 A1 | 5/2011 | Johansson et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0113672 A1 | 5/2012 | Dubrow et al. |
| 2012/0164846 A1 | 6/2012 | Ha et al. |
| 2012/0193693 A1 | 8/2012 | Kanaya |
| 2012/0202356 A1 | 8/2012 | Huang et al. |
| 2012/0213940 A1 | 8/2012 | Mallick |
| 2012/0280200 A1 | 11/2012 | Tada et al. |
| 2012/0282418 A1 | 11/2012 | Chou et al. |
| 2012/0315394 A1 | 12/2012 | Ito |
| 2013/0023120 A1 | 1/2013 | Yaegashi et al. |
| 2013/0032949 A1 | 2/2013 | Lin et al. |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0313583 A1 | 11/2013 | Hwang et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134827 A1 | 5/2014 | Swaminathan et al. |
| 2014/0141542 A1 | 5/2014 | Kang et al. |
| 2014/0141626 A1 | 5/2014 | Hausmann et al. |
| 2014/0182619 A1 | 7/2014 | Goto et al. |
| 2014/0209562 A1 | 7/2014 | LaVoie et al. |
| 2014/0216337 A1 | 8/2014 | Swaminathan et al. |
| 2014/0264555 A1 | 9/2014 | Ahn et al. |
| 2014/0302686 A1 | 10/2014 | Pan et al. |
| 2015/0109814 A1 | 4/2015 | Chen et al. |
| 2015/0126042 A1 | 5/2015 | Pasquale et al. |
| 2015/0147483 A1 | 5/2015 | Fukazawa |
| 2015/0159271 A1 | 6/2015 | Lee et al. |
| 2015/0170900 A1 | 6/2015 | LaVoie |
| 2015/0206719 A1 | 7/2015 | Swaminathan et al. |
| 2015/0235835 A1 | 8/2015 | Swaminathan et al. |
| 2015/0243883 A1 | 8/2015 | Swaminathan et al. |
| 2015/0247238 A1 | 9/2015 | Pasquale et al. |
| 2015/0249013 A1 | 9/2015 | Arghavani et al. |
| 2016/0056037 A1 | 2/2016 | Thombare et al. |
| 2016/0056053 A1 | 2/2016 | Thombare et al. |
| 2016/0064211 A1 | 3/2016 | Swaminathan et al. |
| 2016/0293418 A1 | 10/2016 | Pasquale et al. |

FOREIGN PATENT DOCUMENTS

| | | |
|---|---|---|
| CN | 102934203 A | 2/2013 |
| CN | 103839783 A | 6/2014 |
| EP | 0 277 766 A2 | 8/1988 |
| EP | 0 541 212 A2 | 5/1993 |
| EP | 0 720 213 A2 | 7/1996 |
| EP | 1 703 552 A2 | 9/2006 |
| EP | 2 278 046 A1 | 1/2011 |
| JP | 4364320 B2 | 11/2009 |
| JP | 2010-10497 A | 1/2010 |
| JP | 2010-103539 | 5/2010 |
| JP | 2011-071279 | 4/2011 |
| JP | 2012-142574 | 7/2012 |
| JP | 2013-153164 | 8/2013 |
| KR | 10-2001-0111448 | 12/2001 |
| KR | 10-2004-0001036 | 1/2004 |
| KR | 10-2009-0057665 | 6/2009 |
| KR | 10-2009-0081396 | 6/2009 |
| KR | 10-2009-0080019 | 7/2009 |
| WO | WO 2006/026350 | 3/2006 |
| WO | WO 2006/104741 | 10/2006 |
| WO | WO 2007/118026 | 10/2007 |
| WO | WO 2010/134176 | 11/2010 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/112727 | 8/2013 |

OTHER PUBLICATIONS

U.S. Office Action, dated Jun. 15, 2004, issued in U.S. Appl. No. 10/289,237.

U.S. Notice of Allowance, dated Sep. 3, 2004, issued in U.S. Appl. No. 10/289,237.

U.S. Office Action, dated Sep. 2, 2009, issued in U.S. Appl. No. 12/002,780.

U.S. Notice of Allowance, dated Jan. 27, 2010, issued in U.S. Appl. No. 12/002,780.

U.S. Office Action, dated Oct. 6, 2009, issued in U.S. Appl. No. 12/154,984.

U.S. Final Office Action, dated Apr. 15, 2010, issued in U.S. Appl. No. 12/154,984.

U.S. Office Action dated Mar. 15, 2013 issued in U.S. Appl. No. 13/084,399.

U.S. Final Office Action dated Sep. 13, 2013 issued in U.S. Appl. No. 13/084,399.

U.S. Notice of Allowance dated Jan. 15, 2014 issued in U.S. Appl. No. 13/084,399.

U.S. Office Action dated Jan. 2, 2015 issued in U.S. Appl. No. 14/231,554.

U.S. Final Office Action dated Jun. 10, 2015 issued in U.S. Appl. No. 14/231,554.

U.S. Notice of Allowance dated Aug. 31, 2015 issued in U.S. Appl. No. 14/231,554.

U.S. Office Action dated Sep. 14, 2012 issued in U.S. Appl. No. 13/084,305.

U.S. Final Office Action dated Apr. 25, 2013 issued in U.S. Appl. No. 13/084,305.

U.S. Office Action dated Apr. 13, 2011 issued in U.S. Appl. No. 12/889,132.

(56) References Cited

OTHER PUBLICATIONS

U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated May 15, 2015 issued in U.S. Appl. No. 14/074,617.
U.S. Office Action dated Aug. 14, 2015 issued in U.S. Appl. No. 14/061,587.
U.S. Office Action dated Mar. 2, 2015 issued in U.S. Appl. No. 14/137,860.
U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Notice of Allowance dated Aug. 5, 2015 issued in U.S. Appl. No. 14/183,287.
U.S. Office Action dated Jul. 2, 2015 issued in U.S. Appl. No. 14/187,145.
U.S. Ex Parte Quayle Action dated Oct. 8, 2015 issued in U.S. Appl. No. 14/194,324.
U.S. Notice of Allowance dated Mar. 9, 2016 issued in U.S. Appl. No. 14/194,324.
U.S. Office Action dated Jul. 16, 2015 issued in U.S. Appl. No. 14/464,462.
U.S. Notice of Allowance dated Feb. 12, 2016 issued in U.S. Appl. No. 14/464,462.
U.S. Notice of Allowance dated Jul. 6, 2016 issued in U.S. Appl. No. 14/464,462.
U.S. Office Action dated Mar. 2, 2016 issued in U.S. Appl. No. 14/464,475.
U.S. Notice of Allowance dated Jun. 28, 2016 issued in U.S. Appl. No. 14/464,475.
U.S. Office Action dated Apr. 13, 2015 issued in U.S. Appl. No. 14/335,785.
U.S. Office Action dated Mar. 24, 2017 issued in U.S. Appl. No. 15/177,108.
U.S. Notice of Allowance dated Oct. 18, 2017 issued in U.S. Appl. No. 15/177,108.
PCT International Search Report and Written Opinion, dated Oct. 20, 2011, issued in PCT/US2011/032186.
PCT International Preliminary Report on Patentability, dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in CN 201180045808.6.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
Korean Trial Decision (English description) dated May 25, 2015 issued in KR 10-2012-0043797.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 4, 2017, issued in Application No. CN 201410625311.7.
Chinese Second Office Action dated Sep. 22, 2017, issued in Application No. CN 201410625311.7.
Chinese First Office Action dated Aug. 1, 2017, issued in Application No. CN 201510514930.3.
Chinese First Office Action [no translation] dated Aug. 17, 2017, issued in Application No. CN 201510512616.1.
Abe et al. (2000) "Effect of Ti insertion between Cu and TiN Layers on electromigration reliability in Cu/(Ti)/TiN/Ti layered damascene interconnects", *IEEE* 00CH37059. 38$^{th}$ Annual International Reliability Physics Symposium, San Jose, California, pp. 333-338.

(56) References Cited

OTHER PUBLICATIONS

Cecchi et al., (2007) "Ultra-thin conformal pore-sealing of low-k materials by plasma-assisted ALD," *University of New Mexico*, Albuquerque, NM, *Sandia National Labs*, Albuquerque, NM, 1 page.

Chaukulkar et al., (May/Jun. 2013) "Atomic layer deposition of titanium dioxide using titanium tetrachloride and titanium tetraisopropoxide as precursors," *J. Vac. Sci. Technol. A*, 31(3):031509-1 to 031509-5.

Chen et al. (Jan./Feb. 1999) "Low Temperature Plasma-Assisted Chemical Vapor Deposition of Tantalum Nitride form Tantalum Pentabromide for Copper Metallization," *J. Vac. Sci. Technol.*, B 17(1):182-185.

Cheng et al. (Mar./Apr. 1995) "Directional Deposition of Cu into Semiconductor Trench Structures Using Ionized Magnetron Sputtering," *J. Vac. Sci. Technol.*, B 13(2):203-208.

Cho et al. (Dec. 1998) "Remote Plasma-Assisted Metal Organic Chemical Vapor Deposition of Tantalum Nitride Thin Films with Different Radicals," *Japanese Journal of Appl. Phys.*, 37 (Part 1)(12A):6502-6505.

Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.

D'Couto et al. (2001) "In situ physical vapor deposition of ionized Ti and TiN thin films using hollow cathode magnetron plasma source," *J. Vac. Sci. Technol. B*. 19(1):244-249.

Elam, J.W. (2003) Surface chemistry and film growth TiN atomic layer deposition using TDMAT and $NH^3$, *Elsevier Science B. V.*, 436:145-156.

Endle et al. (May/Jun. 1998) "X-Ray Photoelectron Spectroscopy Study on TiN Films Produced with Tetrakis (dimethylamido)Titanium and Selected N-Containing Precursors on SiO.sub.2," *J. Vac. Sci. Technol.*, A 16(3):1262-1267.

Green et al. (Dec. 1997) "Determination of Flux Ionization Fraction Using a Quartz Crystal Microbalance and a Gridded Energy Analyzer in an Ionized Magnetron Sputtering System," *Rev. Sci. Instrum.*, 68(12):4555-4560.

Han et al. (May 1998) "Barrier Metal Properties of Amorphous Tantalum Nitride Thin Films Between Platnium and Silicon Deposited Using Remote Plasma Metal Organic Chemical Vapor Method," *Jpn. J. Appl. Phys.*, 37 Part 1(5A):2646-2651.

Hausmann et al. (2002) "Atomic Layer Deposition of Hafnium and Zirconium Oxides Using Metal Amide Precursors," *Chem. Mater.* 14(10):4350-4358.

Hayden et al. (1999) "Helion Plasma Source for Ionized Physical Vapor Deposition," 1999, *Surface and Coatings Technology*, pp. 120-121, pp. 401-404.

Hayden et al. (Mar./Apr. 1998) "Characterization of Magnetron-Sputtered Partially Ionized Aluminum Deposition," *J. Vac. Sci. Technol.*, A 16(2):624-627.

Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.

King, Sean W., (Jul./Aug. 2011) "Plasma enhanced atomic layer deposition of $SiN_x$:H and $SiO_2$," *J. Vac. Sci. Technol.* A29(4):041501-1 through 041501-9 (9 pages).

Klawuhn et al. (Jul./Aug. 2000) "Ionized Physical-vapor deposition Using a Hollow-Cathode Magnetron Source for Advanced Metallization," *J. Vac, Sci, Technol.* A, 18(4):1546-1549.

Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].

Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.

Kukli et al., (2000) "Atomic Layer Deposition of Titanium Oxide from $TiI_4$ and $H_2O_2$," *Chemical Vapor Deposition*, 6(6):303-310.

Kukli et al., (2000) "Real-Time Monitoring in Atomic Layer Deposition of $TiO_2$ from $TiI_4$ and $H_2O$—$H_2O_2$," *Langmuir*, 16(21):8122-8128.

Lavareda et al., (2004) "Properties of a-Si:H TFTs using silicon carbonitride as dielectric," Journal of Non-Crystalline Solids, 338-340:797-801.

Lee et al. (1996) "The Failure Mechanism of MOCVD TiN Diffusion Barrier at High Temperature," *Mat. Res. Soc. Symp. Proc.*, 324:279-284.

Lee et al., (2005) "Chemically conformal deposition of $SrTiO_3$ thin films by Atomic Layer Deposition using conventional metal organic precursors and remote-plasma activated $H_2O$ ," School of Materials Science and Engineering, and Inter-university Semiconductor Research Center, Seoul National University, *Microelectronic Engineering* 80:158-161.

Lee, Jong Ju (2005) "Low-impurity, highly conformal atomic layer deposition of titanium nitride using $NH_3$—Ar—$H_2$ plasma treatment for capacitor electrodes," *Materials Letters*, 59:615-617.

Li, Xingcun et al., (2011) "Atomic Layer Deposition $Al_2O_3$ Thin Films in Magnetized Radio Frequency Plasma Source," *Physics Procedia* 18:100-106.

Lucovsky, Gerald et al. (1990) "Formation of Thin Films by Remote Plasma Enhanced Chemical Vapor Deposition (Remote PECVD)," in *Handbook of Plasma Processing Technology*, eds. Rossnagel, Cuomo and Westwood, Noyes Publications, pp. 387-408.

Man P.F. et al., (Feb. 11-15, 1996) "Elimination of Post-Release Adhesion in in Microstructures Using Conformal Fluorocarbon Coatings," *MEMS '96 Proceedings, IEEE*, pp. 55-60.

Manik P. et al. (2012) Fermi-level unpinning and low resistivity in contacts to n-type Ge with a thin ZnO interfacial layer, *App. Phys. Lett.* 101:182105-1-182105-5.

Musher et al. (Feb. 1996) "Atmospheric Pressure Chemical Vapor Deposition of Titanium Nitride from Tetrakis (diethylamido) Titanium and Ammonia," *J. Electochem. Soc.*, 143(2):736-744.

Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.

Peng et al. (Jul./Aug. 1998) "Structural and Electrical Properties of Chemical Vapor Deposition Tungsten Overgrowth on Physical Vapor Deposited and Metalorganic Chemical Vapor Deposited TiNAdhesion Layers," *J. Vac. Sci. Technol., B* 16(4):2013-2018.

Plasma Enhanced Atomic Layer Deposition (PEALD), Website: http://www.asm.com/index.php?option=com_content&task=view &id=19&Itemid=16 1 (2010), 1 page.

"PlasmaPro™ NGP®80 Range," *Oxford Instruments* (2010), 8 pages.

Puurunen, Riikka L. (2005) "Surface chemistry of atomic layer deposition: A case study for the trimethylaluminum/water process," *Journal of Applied Physics*, 97:121301-1-121301-52.

Reif et al. (Feb. 1990) "Plasma Enhanced Chemical Vapor Deposition of Thin Films for Microelectronics," *Handbook of Plasma Processing Technology*, eds: Rossnagel, Cuomo and Westwood, Noyes Publications, pp. 260-284.

Schumacher Products, TDEAT (Tetrakis-diethylamino Titanium), Electronic Grade, www.schumacher.com/tdeat.html, printed Jun. 5, 2001, 1 page.

Schuisky et al., (2000) "Atomic Layer Chemical Vapor Deposition of TiO2 Low Temperature Epitaxy of Rutile and Anatase," *Journal of the Electrochemical Society*, 147(9):3319-3325.

Truong et al. (1995) "Low-Pressure Deposition of TiN Thin Films from a Tetrakis (diethylamido) Titanium Precursor," *J. Phys. Chem*, 99:8831-8842.

Tsai et al. (May 1996) "Comparison of the Diffusion Barrier Properties of Chemical-Vapor-Deposited TaN and Sputtered TaN Between Cu and Si," *J. Appl. Phys.*, 79(9):6932-6938.

Ueki et al. (2004) "Effects of Ti Addition on Via Reliability in Cu Dual Damascene Interconnects," *IEEE Translations on Electron Devices*, 51(11):1883-1891.

van der Straten et al. (2004) "Atomic layer deposition of tantalum nitride for ultrathin liner applications in advanced copper metallization schemes," *Journal of Materials Research*, 19(2):447-453.

(56) References Cited

OTHER PUBLICATIONS

Wu et al. (2008) "Ti-based Barrier for Cu Interconnect Applications", *International Interconnect Technology Conference paper on Jun. 1*, 3 pp.

Zhong et al. (Mar./Apr. 1999) "Ionized Titanium Deposition into High tAspect Ratio Vias and Trenches", American Vacuum Society, *J. Vac. Sci. Technol. B* 17(2):405-409.

Chinese Second Office Action dated Jun. 6, 2018, issued in Application No. CN 201510514930.3.

Chinese Third Office Action dated Jul. 10, 2018, issued in Application No. CN 201410625311.7.

Chinese Second Office Action dated Jul. 3, 2018, issued in Application No. CN 201510512616.1.

Japanese Office Action dated Oct. 16, 2018, issued in JP Application No. 2014-226067.

\* cited by examiner

SOFT LANDING NANOLAMINATES FOR ADVANCED PATTERNING

CROSS-REFERENCE TO RELATED APPLICATION

This application is a continuation of U.S. patent application Ser. No. 15/177,108, filed on Jun. 8, 2016, and titled "SOFT LANDING NANOLAMINATES FOR ADVANCED PATTERNING," which is a division of U.S. patent application Ser. No. 14/194,324 (now U.S. Pat No. 9,390,909), filed on Feb. 28, 2014, issued Jul. 12, 2016, and titled "SOFT LANDING NANOLAMINATES FOR ADVANCED PATTERNING," which is a continuation-in-part of U.S. patent application Ser. No. 14/074,617 (now U.S. Pat. No. 9,287,113), filed Nov. 7, 2013, issued Mar. 15, 2016, and titled "METHODS FOR DEPOSITING FILMS ON SENSITIVE SUBSTRATES," which are incorporated by reference herein in their entireties and for all purposes.

BACKGROUND

Fabrication of advanced integrated circuits often involve patterning of 1× nm half-pitch features in high volume manufacturing of semiconductors. Multiple patterning techniques may enable feature size scaling based on lithographic techniques such as 193 nm immersion lithography. Self-aligned double patterning is an example of a multiple patterning technique. Extensions of order multiple patterning techniques to 11 nm half pitch and below present challenges.

SUMMARY

Provided herein are methods of processing semiconductor substrates to enable deposition of high quality conformal films for use in multiple patterning integration schemes.

One aspect involves a method of processing a semiconductor substrate by depositing a nanolaminate layer on the substrate and depositing a titanium oxide layer on the nanolaminate layer. The nanolaminate layer may have a thickness between about 15 Å and about 200 Å and may have a density lower than the density of the titanium oxide layer. In various embodiments, the method also includes depositing an amorphous carbon layer. In some embodiments, the amorphous carbon layer is patterned. In various embodiments, the nanolaminate layer includes a stack that includes two or more sublayers. In some embodiments, the two or more sublayers include silicon oxide, or titanium oxide, or combinations thereof. In certain embodiments, the stack includes only two sublayers. In some embodiments, the nanolaminate layer includes a first sublayer of silicon oxide and a second sublayer of titanium oxide.

In various embodiments, the nanolaminate layer is silicon oxide or titanium oxide. In certain embodiments, the nanolaminate layer is deposited using a plasma-based process such as plasma-enhanced atomic layer deposition (PEALD) by exposing the substrate to a titanium-containing precursor or a silicon-containing precursor; exposing the substrate to an oxidant; and initiating a plasma while the substrate is exposed to the oxidant. In certain embodiments, the nanolaminate layer is deposited at a temperature between about 50° C. and about 150° C. and the plasma is initiated with a high frequency radio frequency (HFRF) power per square millimeter of substrate area between about $1.768 \times 10^{-4}$ W per $mm^2$ and about $1.768 \times 10^{-3}$ W per $mm^2$. In certain embodiments, the nanolaminate layer is deposited at a temperature less than about 100° C. An example of a titanium-containing precursor that may be used with the methods disclosed herein is tetrakis(dimethylamino)titanium (TDMAT). An example of a silicon-containing precursor is bis(tertiarybutylamino)silane $(SiH_2(NHC(CH_3)_3)_2$ (BTBAS).

In various embodiments, the titanium oxide layer is deposited by PEALD by exposing the substrate to a titanium-containing precursor; exposing the substrate to an oxidant; and initiating a plasma while the substrate is exposed to the oxidant at a HFRF power per square millimeter of substrate area of at least about $1.768 \times 10^{-3}$ W per $mm^2$. Examples of oxidants include nitrous oxide, oxygen, carbon dioxide or a combination thereof. The titanium oxide layer may be deposited at a temperature between about 50° C. and about 400° C. in some embodiments.

Another aspect involves a method of processing a semiconductor substrate by depositing a core layer; depositing a nanolaminate layer on the core layer; and depositing a metal nitride or metal oxide layer on the nanolaminate layer. In some embodiments, the core layer is patterned. In certain embodiments, the core layer may be amorphous carbon or a photoresist. In various embodiments, the nanolaminate layer may be silicon oxide or titanium oxide. In some embodiments, the thickness of the deposited nanolaminate layer is between about 15 Å and about 200 Å.

In certain embodiments, the nanolaminate layer is deposited using PEALD by exposing the substrate to a titanium-containing precursor or a silicon-containing precursor; exposing the substrate to an oxidant; and initiating a plasma while the substrate is exposed to the oxidant. In various embodiments, the nanolaminate layer is deposited at a temperature between about 50° C. and about 150° C. and the plasma is initiated with HFRF power per square millimeter of substrate area between about $1.768 \times 10^{-4}$ W per $mm^2$ and about $1.768 \times 10^{-3}$ W per $mm^2$. In some embodiments, the nanolaminate layer is deposited at a temperature less than about 100° C.

In various embodiments, the metal nitride or metal oxide layer includes titanium oxide or silicon oxide. The metal nitride or metal oxide layer may have etch selectivity to the core. In certain embodiments, the metal nitride or metal oxide layer is deposited using PEALD by exposing the substrate to a metal-containing precursor; exposing the substrate to an oxidant; and initiating a plasma while the substrate is exposed to the oxidant at a HFRF power per square millimeter of substrate area of at least about $1.768 \times 10^{-3}$ W per $mm^2$. Examples of oxidants include nitrous oxide, oxygen, carbon dioxide or combinations thereof. In some embodiments, the metal nitride or metal oxide layer is deposited at a temperature between about 50° C. and about 400° C.

Another aspect involves a method of processing a semiconductor substrate by (a) exposing the substrate to a first titanium-containing precursor or a silicon-containing precursor; (b) exposing the substrate to a first oxidant; (c) initiating a first plasma while the substrate is exposed to the first oxidant with a HFRF power per square millimeter of substrate area between about $1.768 \times 10^{-4}$ W per $mm^2$ and about $1.768 \times 10^{-3}$ W per $mm^2$; (d) exposing the substrate to a second titanium-containing precursor; (e) exposing the substrate to a second oxidant; and (f) initiating a second plasma while the substrate is exposed to the second oxidant with a HFRF power per square millimeter of substrate area of at least about $1.768 \times 10^{-3}$ W per $mm^2$.

In some embodiments, (a) through (c) are processed at temperature between about 50° C. and 150° C. In some embodiments, (d) through (f) are processed at temperature between about 50° C. and 400° C. In some embodiments, (d) through (f) are processed at a higher temperature than (a) through (c) such that transitioning from (c) to (d) includes raising the substrate temperature by at least about 50° C., at least about 100° C., at least about 150° C., or at least about 200° C.

The first titanium-containing precursor and the second titanium-containing precursor may be the same precursor, e.g., TDMAT. In some embodiments, the first oxidant may be the same as the second oxidant (e.g., nitrous oxide, oxygen, carbon dioxide or combinations thereof). In some embodiments, it may be advantageous to use a different oxidant or mixture. In some embodiments, the substrate includes amorphous carbon. In some embodiments, the amorphous carbon is patterned.

In various embodiments, the method also includes after initiating the second plasma, planarizing the substrate to expose the amorphous carbon, and selectively etching the amorphous carbon to form a mask.

Another aspect involves a method of patterning a semiconductor substrate by, prior to depositing a conformal film on a core layer, depositing a nanolaminate protective layer on a patterned core layer; depositing a conformal film on the nanolaminate protective layer; planarizing the conformal film to expose the core; and selectively etching the core to form a mask.

In certain embodiments, the core layer includes amorphous carbon. In various embodiments, the nanolaminate protective layer includes silicon oxide or titanium oxide. In certain embodiments, the thickness of the nanolaminate protective layer is between about 15 Å and about 200 Å. In many embodiments, the nanolaminate protective layer is deposited using PEALD by exposing the substrate to a titanium-containing precursor or a silicon-containing precursor; exposing the substrate to an oxidant; and initiating a first plasma while the substrate is exposed to the oxidant.

In some embodiments, the nanolaminate protective layer is deposited at a temperature less than about 100° C. In various embodiments, the nanolaminate protective layer is deposited at a temperature between about 50° C. and 150° C. and the first plasma is initiated at a HFRF power per square millimeter of substrate area between about $1.768 \times 10^{-4}$ W per mm$^2$ and about $1.768 \times 10^{-3}$ W per mm$^2$.

In some embodiments, the titanium oxide layer is deposited using PEALD by exposing the substrate to a titanium-containing precursor; exposing the substrate to an oxidant; and initiating a second plasma while the substrate is exposed to the oxidant at a HFRF power per square millimeter of substrate area of at least about $1.768 \times 10^{-3}$ W per mm$^2$.

Another aspect involves an apparatus for processing a semiconductor substrate including one or more process chambers; one or more gas inlets into the process chambers and associated flow-control hardware; a HFRF generator; and a controller having at least one processor and a memory, such that the at least one processer and the memory are communicatively connected with one another, the at least one processor is at least operatively connected with the flow-control hardware and HFRF generator, and the memory stores computer-executable instructions for: exposing the substrate to a metal-containing precursor; exposing the substrate to a first oxidant; initiating a first plasma while the substrate is exposed to the first oxidant with a HFRF power of between about 12.5 W and 125 W; exposing the substrate to a titanium-containing precursor; exposing the substrate to a second oxidant; and initiating a second plasma while the substrate is exposed to the second oxidant with HFRF power of at least about 125 W.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Fabrication of semiconductor devices typically involves depositing one or more thin films in an integrated manufacturing process and may include patterning steps. Multiple patterning techniques are used to fabricate advanced integrated circuits, such as those with smaller features or higher aspect ratios, or down to 2× or 1× nm nodes. The term "1×" node means a process node between 10 nm and 19 nm and the term "2×" node means a process node between 20 nm and 29 nm. An example of multiple patterning is self-aligned double patterning, which produces double the number of features of a pattern formed by conventional lithography. As the devices become smaller, narrower half-pitch features may be attained using advanced multiple patterning techniques, such as quadruple patterning, or "quad patterning."

Figure 1:
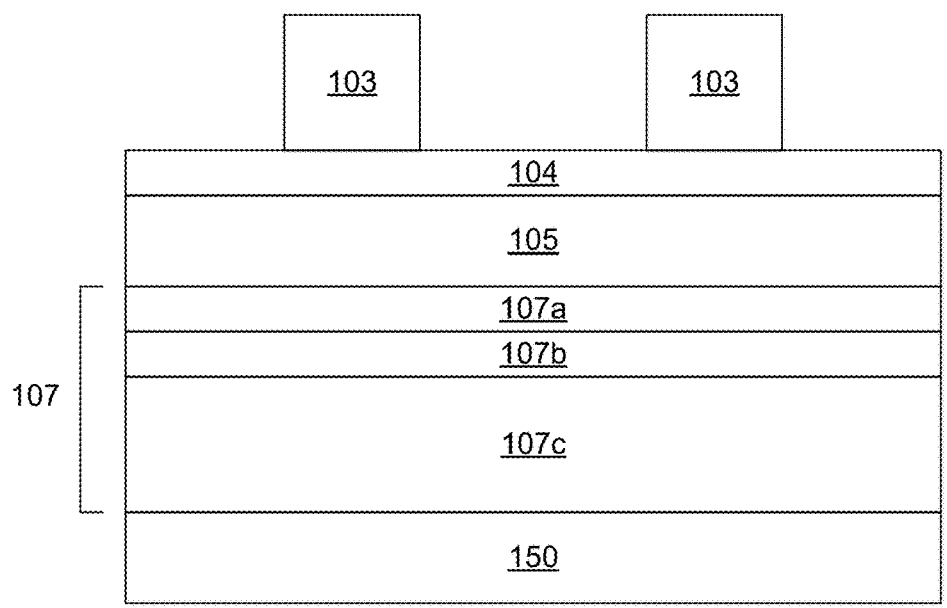
FIGS. 1-11 are schematic depictions of an integration scheme in accordance with disclosed embodiments.

An example of a quad patterning scheme is provided in FIGS. 1-11. FIG. 1 provides a schematic illustration of an example of various layers that may be included in a multi-layer stack, such as on a wafer suitable for semiconductor processing. The multi-layer stack in FIG. 1 includes a first core layer formed into first cores (also referred to as first mandrels) 103, which may be lithographically defined in a previous process, on top of a hardmask 104. Hardmask 104 may be on top of a second core layer 105, which is itself deposited on layer 107. Layer 107 may include a hardmask layer 107a, a cap layer 107b, and a mask layer 107c, which may be used as a mask to pattern a subsequent target layer 150. Barrier layers, cap layers, or etch stop layers may be between the mask layer 107c and target layer 150. One of ordinary skill in the art will appreciate that there may be one or more layers deposited between any of the above described layers, and the target layer 150 may include one or more additional layers.

The first core layer (and thus first cores 103) may be highly etch selective to other materials in the stack, such as silicon and/or silicon-based oxides or nitrides, for example, and may be transparent. The first core layer may be a photoresist or may be made of amorphous carbon material or amorphous silicon material. In some embodiments, the first core layer may be deposited on top of hardmask 104 by a deposition technique, such as plasma-enhanced chemical vapor deposition (PECVD), and the deposition technique may involve generating a plasma in the deposition chamber from deposition gases including a hydrocarbon precursor. The hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used. Alternatively a single RF plasma source may be used. Typically such a source will be a HFRF source.

Under the first core layer formed into first cores 103 is a second core layer 105. Between the first core layer and the second core layer 105 may be a hardmask 104. The hardmask 104 may have high etch selectivity relative to first core layer and second core layer 105 so as not to etch second core layer 105 while first core layer is patterned. The second core layer 105 may be made of amorphous carbon material or amorphous silicon material. Methods of deposition and deposition precursors may be any of those described above with respect to first core layer. Once patterned, the second core layer 105 is formed into second cores (also referred to as second mandrels) 105' (shown in FIG. 5) and may be used to etch a mask in a subsequent layer, such as mask layer 107c, which may then be used to pattern the target layer 150. In certain embodiments, the mask layer 107c may be made of amorphous carbon material or amorphous silicon material. In quadruple patterning schemes, such as that depicted in FIGS. 1-11, the mask layer 107c may be the quadruple pattern of a photoresist pattern such that one feature in a photoresist is patterned and transferred to form four features in the target layer 150.

Between the second core layer 105 and target layer 150 may be other layers, such as a hardmask layer 107a, or cap layer 107b, or a mask layer 107c to be used to pattern the target layer 150. The target layer 150 may be the layer ultimately to be patterned. The target layer 150 may be a semiconductor, dielectric or other layer and may be made of silicon (Si), silicon oxide ($SiO_2$), silicon nitride (SiN), or titanium nitride (TiN), for example. The target layer 150 may be deposited by atomic layer deposition (ALD), plasma-enhanced ALD (PEALD), chemical vapor deposition (CVD), or other suitable deposition techniques.

In one example, the compositions and thicknesses of a quad patterning stack such as the one shown in FIG. 1 may be the following: 400 Å amorphous carbon first cores 103, 150 Å tetraethylorthosilicate (TEOS) hardmask layer 104, 350 Å amorphous carbon second core layer 105, 150 Å TEOS hardmask layer 107a, 100 Å amorphous silicon cap layer 107b, 300 Å amorphous carbon mask layer 107c, 200 Å titanium nitride barrier layer (not shown), and 300 Å TEOS hardmask layer (not shown), all on a silicon target layer or substrate 150. In one example, the following may be deposited on top of the 400 Å amorphous carbon first core layer in order prior to lithographic patterning to define the first core layer as depicted in the example of FIG. 1: 100 Å-150 Å SiON etch stop layer, 300 Å bottom anti-reflective coating (BARC) layer, and 1000 Å photoresist first core layer.

Figure 2:
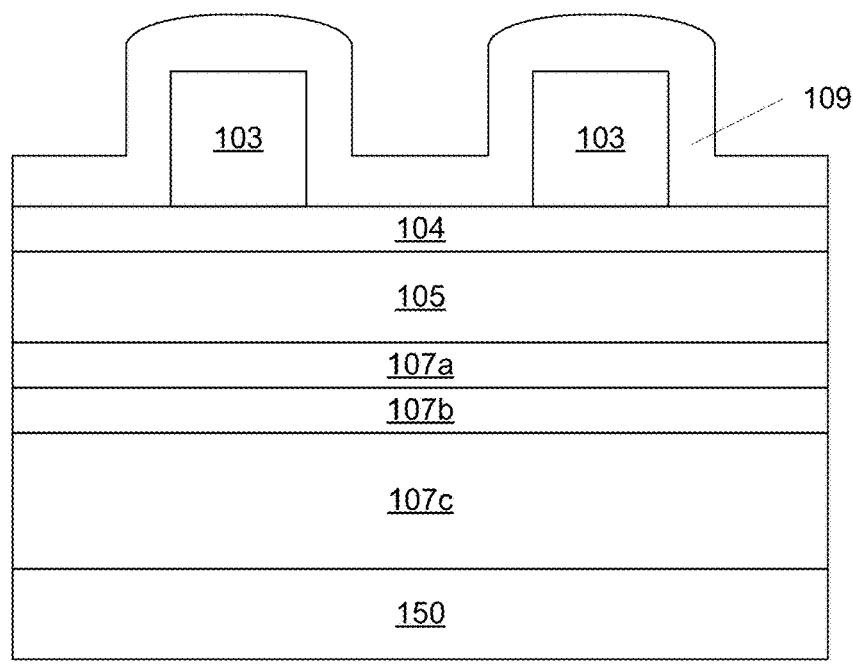

In FIG. 2, a conformal film 109 is deposited over the first cores 103. The conformal film 109 may also be referred to as a "spacer" and may be deposited to conform to the shape of the pattern on the multi-layer stack to make an evenly distributed layer over the pattern. As described further below, the conformal film 109 may be formed into multiple individual spacers, each of which abuts a sidewall of the first cores 103. The conformal film 109 has a high etch selectivity to the core. For example, the conformal film 109 may have an etch selectivity greater than 3:1 relative to an amorphous carbon layer. In some embodiments, conformal film 109 has an etch selectivity greater than 15:1 relative to poly-silicon in halide etch chemistry.

The conformal film 109 may be made of dielectric material, such as $SiO_2$. The conformal film 109 may also be an oxide, such as titanium oxide ($TiO_2$), or may be silicon nitride (SiN). In some embodiments, the conformal film 109 is made of denser material to withstand more "passes" of patterning and may be deposited by ALD, PEALD, or conformal film deposition (CFD) methods as described briefly below.

ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, thermal energy provided to the substrate activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness. In an example of a PEALD process, a plasma is initiated while the second film precursor P2 is introduced to the reactor to activate the reaction between P1 and P2.

CFD may be used to deposit the conformal film 109. Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process may be shortened or eliminated in an example CFD process. Further, in some embodiments, plasma activation of deposition reactions may result in lower deposition temperatures than thermally-activated reactions, potentially reducing the thermal budget of an integrated process. For context, a short description of CFD is provided. The concept of a CFD cycle is relevant to the discussion of various embodiments herein. As with ALD processes, generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. The cycle may include certain ancillary steps such as sweeping one or more of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface. As used herein, the term PEALD includes CFD processes.

The following conditions are examples of conditions suitable depositing a silicon oxide conformal film 109 by a CFD process. Deposition may occur at a temperature between about 50° C. and about 400° C., at a pressure between about 0.5 Torr and about 10 Torr, and an RF power for four stations between about 100 W and 10 kW. RF activation frequency can vary from about 13.56 MHz to 40 MHz for various embodiments. For a silicon oxide conformal film 109, process gases that may be used include, as a silicon source, a silicon amide (e.g., BTBAS, BDEAS (bis-di-ethyl aminosilane) or DIPAS (di-isopropyl aminosilane), and, as an oxygen source, oxygen or nitrous oxide or carbon dioxide, separately or together, diluted with an inert carrier gas, for example argon or nitrogen. Process gas flow rates may be as follows: for (liquid) silicon precursor (e.g., BTBAS, BDEAS, and DIPAS), between about 1 sccm and 3 sccm, for example BTBAS at about 2.5 sccm; for oxygen precursor ($O_2$, $N_2O$), between about 5000 sccm and 10,000 sccm, for example $N_2O$ at 5000 sccm; and for the carrier gas (Ar or $N_2$), between about 0 sccm and 10,000 sccm, for example about 5000 sccm Ar.

Figure 3:
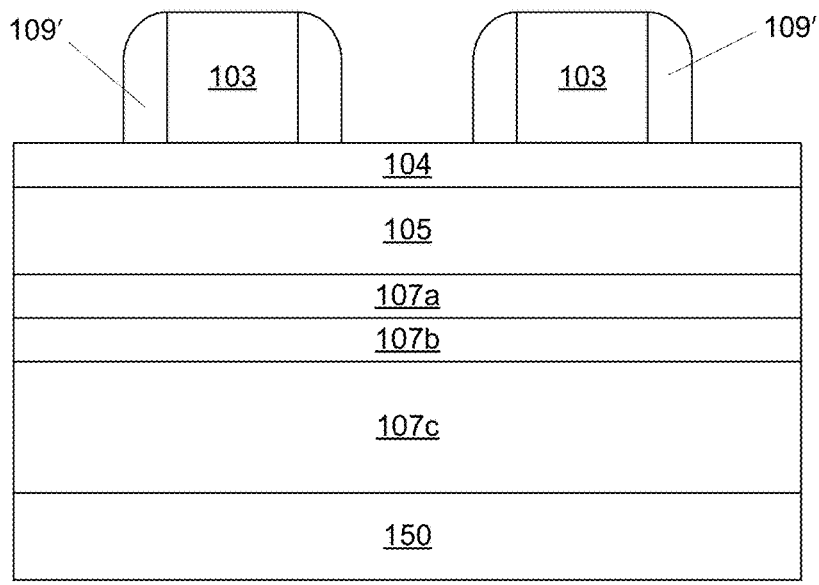

In FIG. 3, the conformal film 109 is etched back or planarized to expose the first cores 103. In various embodiments, the conformal film 109 may be planarized through a multi-step process. In one example, the conformal film 109 may be etched back by first flowing about 10 sccm to about 100 sccm of chlorine ($Cl_2$), then about 10 sccm to about 100 sccm of methane ($CH_4$), then about 10 sccm to about 100 sccm of nitrogen ($N_2$) for about 30 seconds. In some embodiments, the conformal film 109 may be etched at a temperature between about 10° C. and about 20° C. and at a pressure between about 2 mTorr and about 20 mTorr for a time of about 30 seconds. In some embodiments, the substrate may be etched at a temperature between about 40° C. and about 60° C. and at a pressure between about 5 mTorr and about 100 mTorr. In many embodiments, an anisotropic plasma etch is performed to expose the core and define the structure of the spacers 109' from the conformal film 109.

Figure 4:
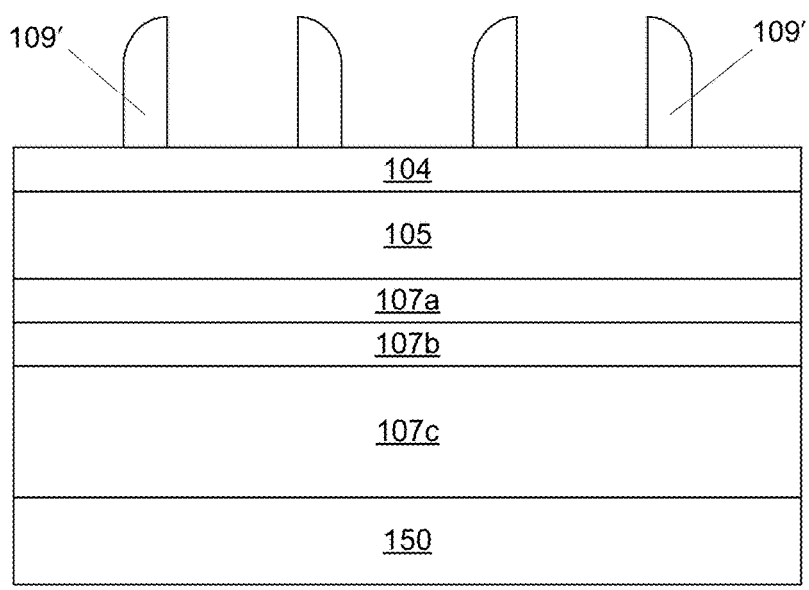

In FIG. 4, the first cores 103 are stripped or etched, leaving free-standing spacers 109' on the substrate. If the first core layer is a photoresist, the first cores 103 may be etched by flowing oxygen ($O_2$) at a flow rate between about 100 sccm and about 200 sccm at a temperature between about 40° C. and about 60° C. in a pressure between about 5 mTorr and about 20 mTorr.

If the first core layer is made of amorphous carbon material, the first cores 103 may be stripped or etched using an ashing method. An ashing method may be dependent on chemical reactions for material removal, rather than directional movement of energetic ions. For example, any surface that is exposed to the process gas used in an ashing operation may experience material removal due to the exposure, so the amorphous carbon material used in the first cores 103 may have high etch selectivity to the spacers 109' such that the spacers 109' are not etched while the first cores 103 are ashed. Additionally, in contrast to some chemical etching processes, ashing operations may produce a reaction product that is completely in the gas phase. Ashing operations for carbon films may, for example, utilize dissociated hydrogen ($H_2$) or oxygen ($O_2$) as a process gas, which may react with carbon films to form such gas-phase reaction byproducts. In some embodiments, the remaining spacers 109' may be shaped for subsequent processing using various etch conditions.

Figure 5:
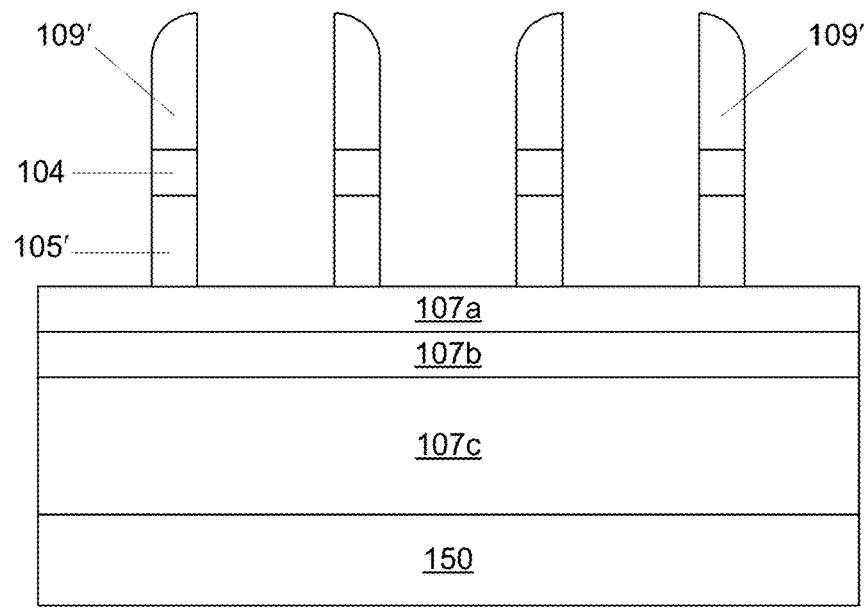

In FIG. 5, the second core layer 105 is etched down using the spacers 109' as a mask, thereby transferring the pattern to form second cores 105'. The second core layer 105 may be etched at a temperature between about 50° C. and about 70° C. in a pressure between about 5 mTorr and about 100 mTorr using chemistry suitable for etching the second core layer 105 but not the spacers 109'. The second core layer 105 is thus highly etch selective to the spacers 109'. The second core layer 105 may be an amorphous carbon layer, or amorphous silicon layer. Above the second core layer 105 may be a cap layer 104, which may be a silicon anti-reflective coating, or PECVD dielectric layer, or spin-on glass.

Figure 6:
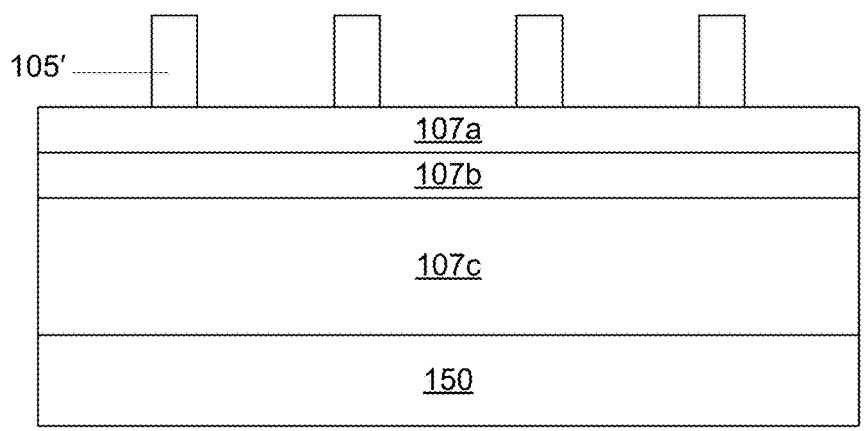

In FIG. 6, the spacers 109' and the cap layer 104 are etched or otherwise removed, leaving the patterned second cores 105'. In some embodiments, the spacers 109' may be removed at a temperature between about 10° C. and about 20° C. and at a pressure between about 2 mTorr and about 20 mTorr for a time of about 30 seconds. In some embodiments, the substrate may be etched at a temperature between about 40° C. and about 60° C. and at a pressure between about 5 mTorr and about 100 mTorr. In many embodiments, an anisotropic plasma etch is performed. In one example, the spacers 109' are etched by first flowing about 10 sccm to about 100 sccm of chlorine ($Cl_2$), then about 10 sccm to about 100 sccm of methane ($CH_4$), then about 10 sccm to about 100 sccm of nitrogen ($N_2$) for about 30 seconds.

Figure 7:
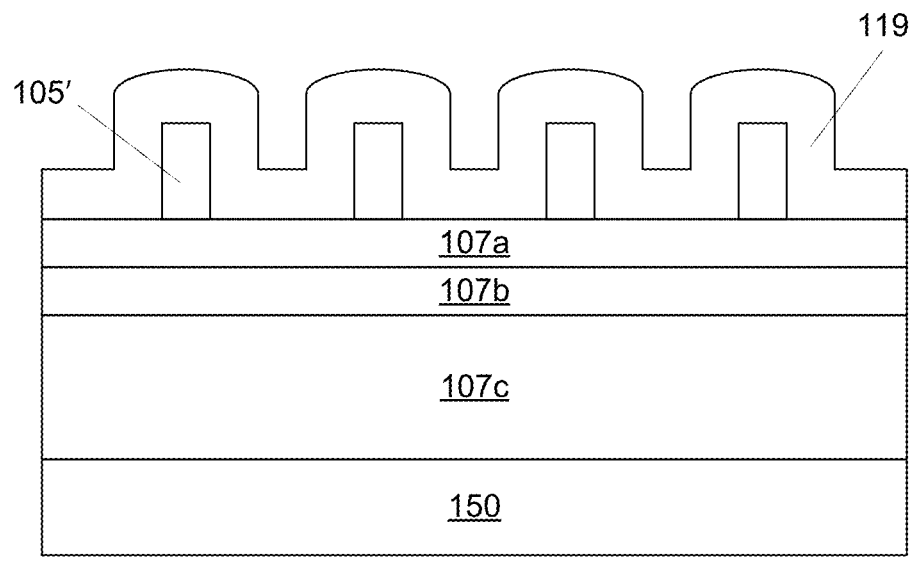

In FIG. 7, a second conformal film 119 is deposited over the patterned second cores 105'. In many embodiments, the second conformal film 119 may be a layer of titanium oxide, which may be deposited by PEALD methods.

Figure 8:
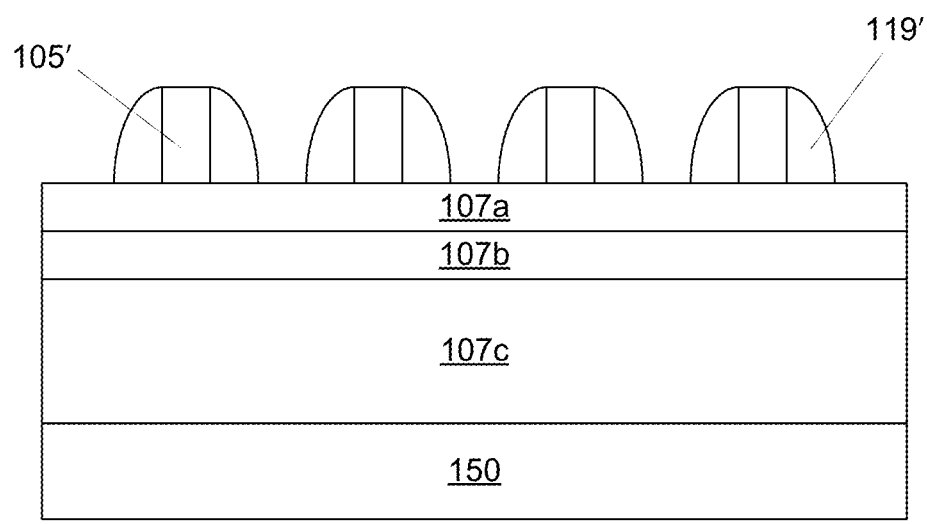

In FIG. 8, the second conformal film 119 is etched or planarized to expose the second cores 105'. Conditions and methods may be any of those discussed above with respect to FIG. 3.

Figure 9:
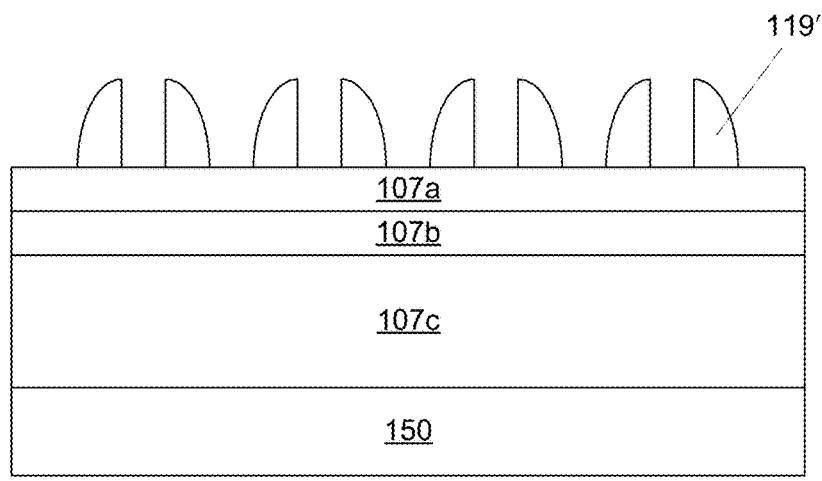

In FIG. 9, the second cores 105' is etched or removed, leaving free-standing second spacers 119'. Conditions and methods may be any of those discussed above with respect to FIG. 4.

Figure 10:
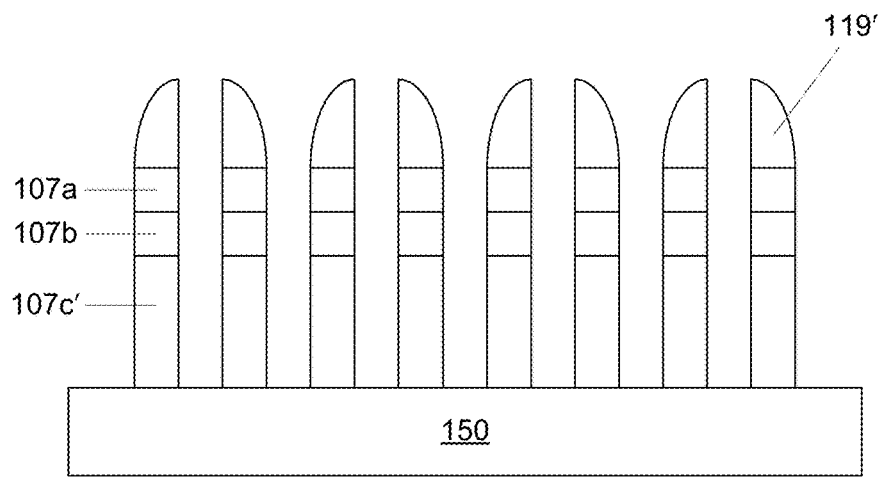

In FIG. 10, the mask layer 107c is etched down using the second spacers 119' as a mask, thereby transferring the pattern from the second spacers 119' to form a patterned mask 107c'. Mask layer 107c may be highly etch selective to the second conformal film 119, and may be etched by any method discussed above with respect to FIG. 5, depending on the chemistry of the mask layer 107c.

Figure 11:
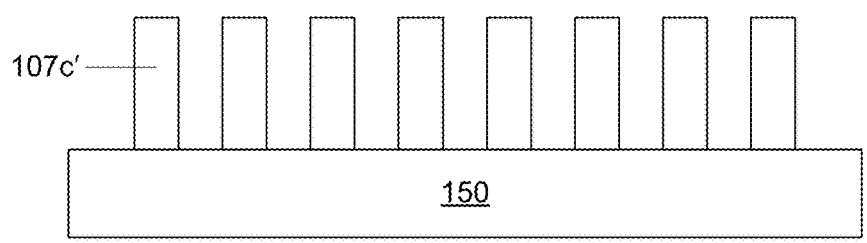

In FIG. 11, the second spacers 119' are removed, along with etch stop layer 107a and cap layer 107b, leaving the patterned mask 107c'. Conditions and methods for removing the second spacers 119' may be any of those discussed above with respect to FIG. 6. The mask 107c' may then be used to pattern subsequent layers, such as target layer 150. The result of process steps depicted in FIGS. 1 through 11 is a quad-patterning scheme such that a single lithographically defined feature (such as a first core 103 in FIG. 1) results in four smaller features on the substrate. Quad patterning schemes may be used to form features with a half-pitch as small as 10 nm, or between 10 nm and 20 nm half-pitch, which cannot be achieved by current double patterning schemes.

Due to the nature of forming the smaller features, the material used for the second conformal film 119 may be of higher quality relative to conformal films used in spacers of wider cores so as to maintain robustness and prevent buckling when it is exposed to harsh conditions in subsequent patterning steps. Higher quality conformal film material may have near-ideal stoichiometry, such as if the conformal film is titanium oxide, the higher quality titanium oxide conformal film may have near ideal Ti:O stoichiometry, for example 1:2, and low carbon content. Higher quality conformal films may be deposited by ALD, which may perform a complete conversion from the oxidation half-reaction, thereby forming near ideal stoichiometry. Thus, higher quality conformal film material may then have a low etch rate and high etch selectivity, and also being infinitely selective against oxides and nitrides. These films may also have higher modulus, such as greater than about 150 MPa, which contributes to improved mechanical stability of the conformal film as a spacer, thereby improving critical dimension uniformity (CDU). The higher quality conformal film material disclosed herein may also be dense to withstand subsequent integration steps.

Provided herein are methods of depositing thin, conformal nanolaminate protective layers. Also provided are methods of forming high quality films that may be used as spacers, with the methods including deposition of a nanolaminate layer. The nanolaminate layers can improve spacer robustness while protecting the underlying core layer from degradation during deposition of the conformal film.

Deposition of high quality films, such as high quality titanium oxide, directly on a core layer may result in degradation or consumption of the core due to harsh conditions during deposition of the spacer, thereby harming the underlying patterned core. For example, during deposition of the high quality conformal film, a patterned core layer may be exposed to oxygen radicals, such as those produced from a $N_2O/O_2$ sequential plasma with a high HFRF power of at least about 1000 W. Due to the higher power, more oxygen radicals are formed, which increases radical bombardment on the core layer and subsequent degradation the pattern of the core. Nitrides may be able to withstand such bombardment if used as a cap over the core layer, but since nitrides are not selective to certain core materials, nitrides are not suitable. After a conformal film is deposited, the substrate may then be planarized to expose the core and remove the core, but since the core has been consumed or degraded, the resulting width between spacers may be diminished, which results in an irregular pattern in the semiconductor substrate. Rather than using lower quality conformal films to prevent degradation of the core, the methods disclosed herein enable high quality spacer materials.

Nanolaminate protective layers may be less dense than conformal film due to the lower HFRF power used during deposition. As such nanolaminate protective layers may be deposited at a minimum thickness that adequately protects the core. Minimizing the nanolaminate protective layer may facilitate subsequent integration. Nanolaminate protective layers may protect an underlying layer to the extent that a higher quality conformal film may be deposited over it. Core consumption and degradation thereby decreases and the core can withstand harsher conditions during deposition of the high quality conformal film. In subsequent patterning steps, the high quality conformal film can withstand other harsh conditions and still maintain its strong robustness as a free-standing structure. The nanolaminate protective layers may also prevent spacer leaning and enable critical dimension variability, by maintaining the integrity of the core geometry and providing mechanical support to the free-standing spacer structures, thereby enhancing the ability to form finer features at lower half-pitch in semiconductor processing.

Figure 12:
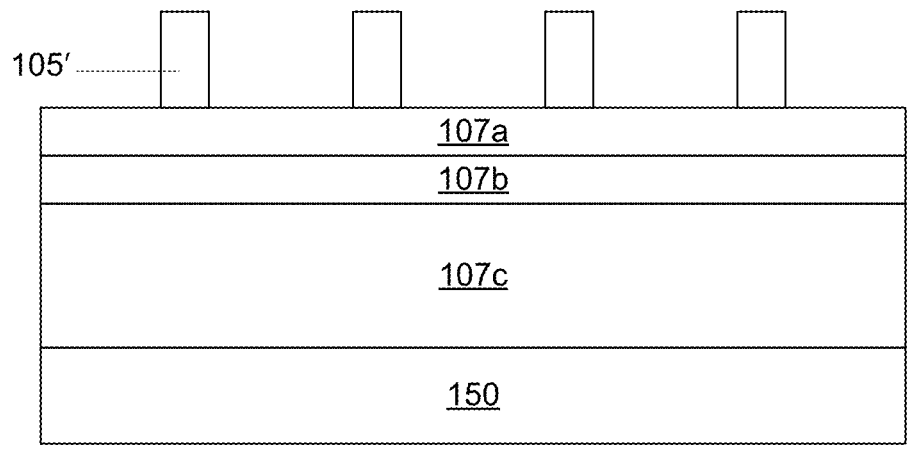
FIGS. 12-18 are schematic depictions of an integration scheme in accordance with disclosed embodiments.

An example of a method of using a nanolaminate protective layer may begin by providing a multi-stack semiconductor substrate with a lithographically defined or patterned first core layer, such as the one discussed above with respect to FIG. 1. In some embodiments, a nanolaminate protective layer may be deposited on the first cores 103 prior to depositing a conformal film 109 as described in embodiments below with respect to FIG. 13. In various embodiments, a conformal film 109 may be deposited over the first cores 103, such as in FIG. 2. After the conformal film 109 is planarized, such as shown in FIG. 3, the first cores 103 may be etched or removed to reveal the remaining spacers 109', such as shown in FIG. 4. A second core layer 105 may be etched down using the spacers 109' as a mask to thereby transfer the pattern to form the second cores 105' such as shown in FIG. 5. The spacers 109' may be removed to reveal patterned second cores 105' such as shown in FIG. 12. The second core layer 105 may be an amorphous carbon layer, or an amorphous silicon layer.

Figure 13:
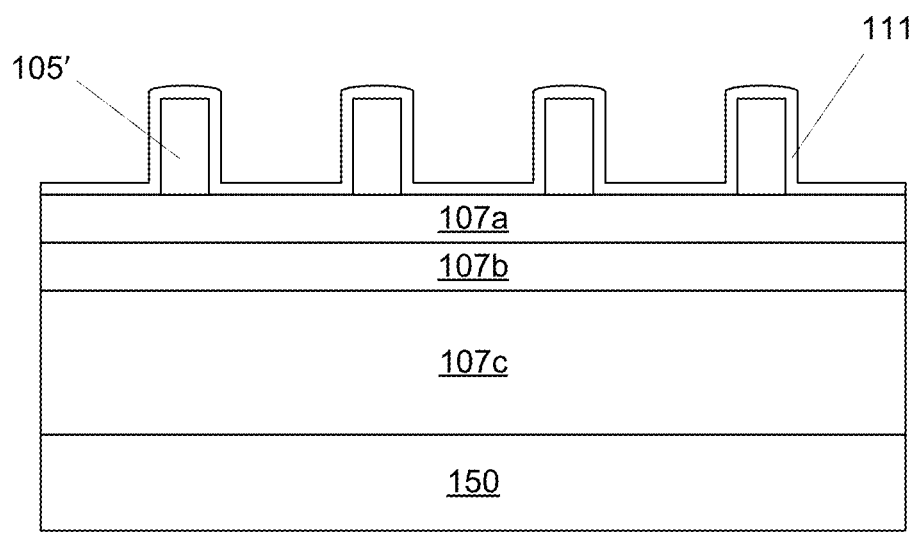

In FIG. 13, a nanolaminate protective layer 111 may be deposited conformally over the second cores 105'. Examples of thicknesses of the nanolaminate layer 111 are between about 15 Å and about 200 Å thick, between about 15 Å and about 100 Å thick, or between about 15 Å and about 50 Å thick. Note that the thickness depicted in FIG. 13 is exaggerated for the purposes of the illustration and as an example only.

In some embodiments, the nanolaminate layer 111 may include a stack, which may have two or more sublayers (not shown). For example, the stack may be a bilayer. In some embodiments the sublayers have the same composition, and in some embodiments, the sublayers have different compositions. In some embodiments, the nanolaminate layer 111 is one layer. In one example, the nanolaminate layer 111 is one layer of silicon oxide. In another example, the nanolaminate layer 111 is one layer of titanium oxide. In one example of a bilayer nanolaminate layer 111, the upper layer is silicon oxide, and the lower layer is titanium oxide. In another example of a bilayer nanolaminate layer 111, the upper layer is titanium oxide and the lower layer is silicon oxide.

The nanolaminate layer 111 may also be less dense than the material deposited in a conformal film due to the lower HFRF power which may be used to deposit the nanolaminate layer 111. In some embodiments, the nanolaminate layer 111 may be an ALD oxide, such as silicon oxide ($SiO_2$) or titanium oxide ($TiO_2$) and referred to as "soft" ALD oxide. The thickness of the nanolaminate layer 111 may be taken into account when configuring processing conditions for the patterning scheme and deciding the pattern to be etched. In various embodiments, the nanolaminate layer 111 is deposited by conformal film deposition (CFD) or PEALD.

Figure 14:
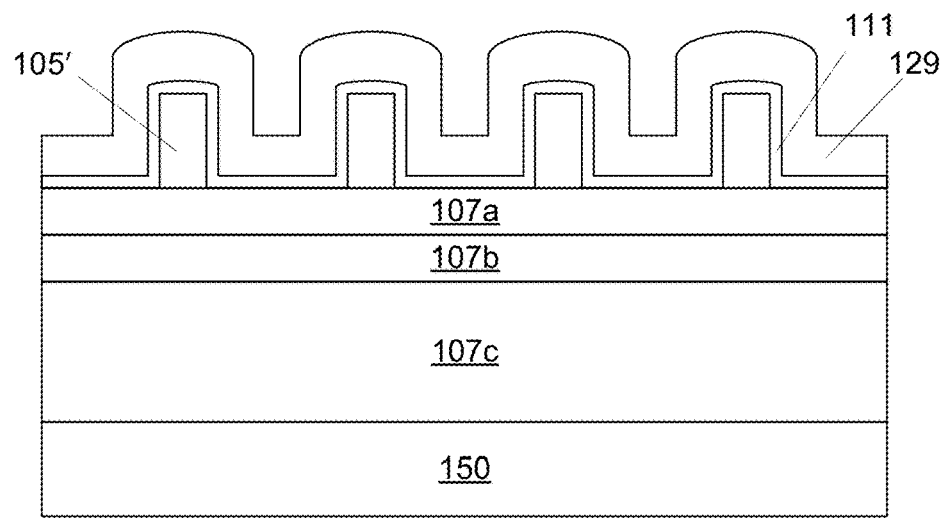

In FIG. 14, the second conformal film 129 is deposited over the nanolaminate layer 111. In certain embodiments, the second conformal film 129 is a high quality titanium oxide film, such as a titanium oxide layer with a low wet etch rate and high dry etch selectivity with infinite selectivity against oxides such as silicon oxide ($SiO_2$) and nitrides such as silicon nitride (SiN). For example, the second conformal film 129 may have an etch selectivity greater than 3:1 relative to an amorphous carbon layer. In some embodiments, second conformal film 129 has an etch selectivity greater than 15:1 relative to a poly silicon layer in halide etch chemistry. In one example, a nanolaminate layer 111 deposited to a thickness of about 15 Å may be sufficient to protect second cores 105' from deposition of about 110 Å of the second conformal film 129. In various embodiments, the second conformal film 129 is deposited by CFD or PEALD. In some embodiments the second conformal film 129 is denser than the nanolaminate layer 111.

Figure 15:
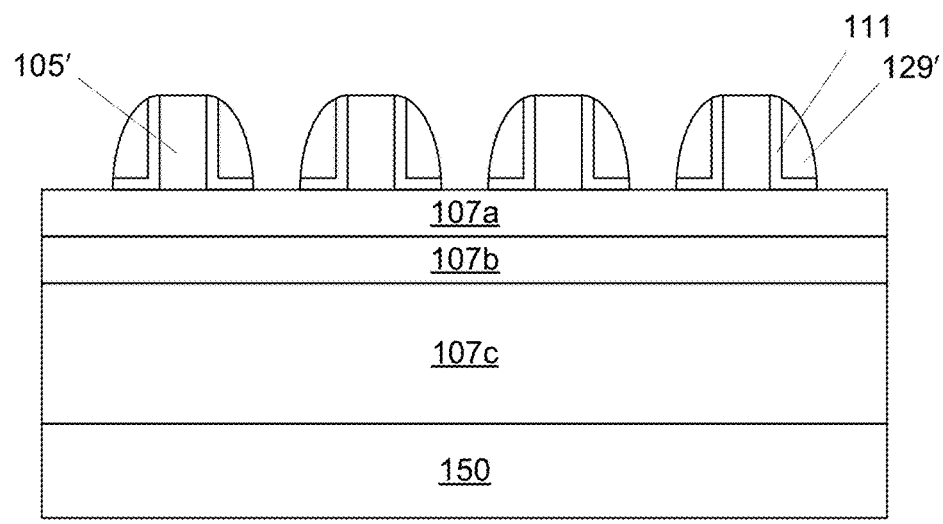

In FIG. 15, the substrate is planarized to expose the second cores 105' with nanolaminate layer 111 sidewalls and yield sidewall second spacers 129'. The conditions for the planarization may be any of those described above with respect to FIG. 3.

Figure 16:
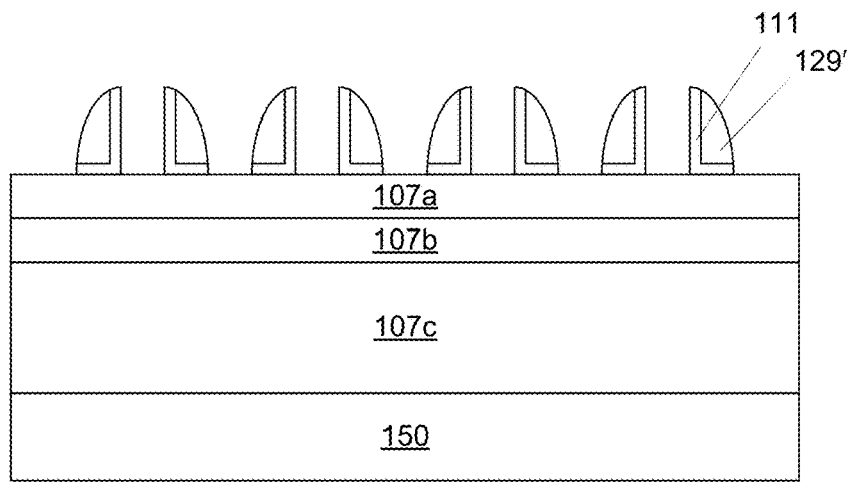

In FIG. 16, the second cores 105' are etched and removed. Conditions and methods may be any of those discussed above with respect to FIG. 9. In some embodiments, a small portion of the nanolaminate layer 111 may be etched due to the nature of the etching step. In some embodiments, the nanolaminate layer 111 is sufficiently etch selective and is not etched while the second cores 105' are removed. Note the second spacers 129' are sitting on a thin layer of nanolaminate layer 111 with a thin nanolaminate layer 111 on its sidewall, which may thereby reinforce its stability and prevent leaning. Still further, in some embodiments, the nanolaminate material may be completely removed with the second cores 105'. As noted above, in some embodiments, the thickness of the nanolaminate layer 111 and how much of it will be removed may be taken into account when planning the patterning scheme to arrive at the desired dimension. However, in some embodiments, the thickness of the nanolaminate layer 111 may be within the tolerance of the patterned dimensions, and may not need to be accounted for.

Figure 17:
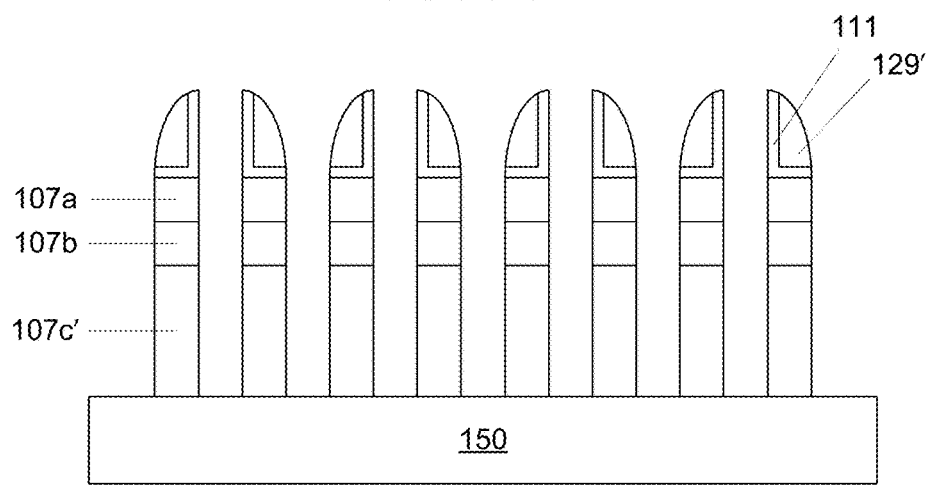

In FIG. 17, the mask layer 107c is etched down using the second spacers 129' as a mask. Due to the increased stability and robustness of the higher quality second spacers 129', this operation may be more easily and more efficiently completed to form fine, stable features with high aspect ratios.

Figure 18:
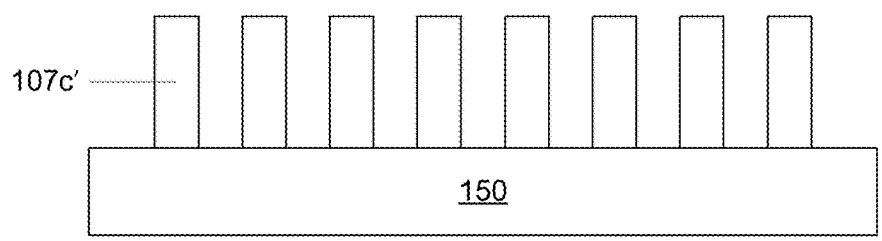

In FIG. 18, the nanolaminate layer 111 and second spacers 129' are etched or removed to reveal the resulting patterned mask 107c'. Conditions and methods may be any of those described above with respect to FIG. 5. The patterned mask 107c' may then be used to pattern a subsequent layer, which can be used to pattern the target layer 150. In some embodiments, the patterned mask 107c' may be used to pattern the target layer 150.

Figure 19:
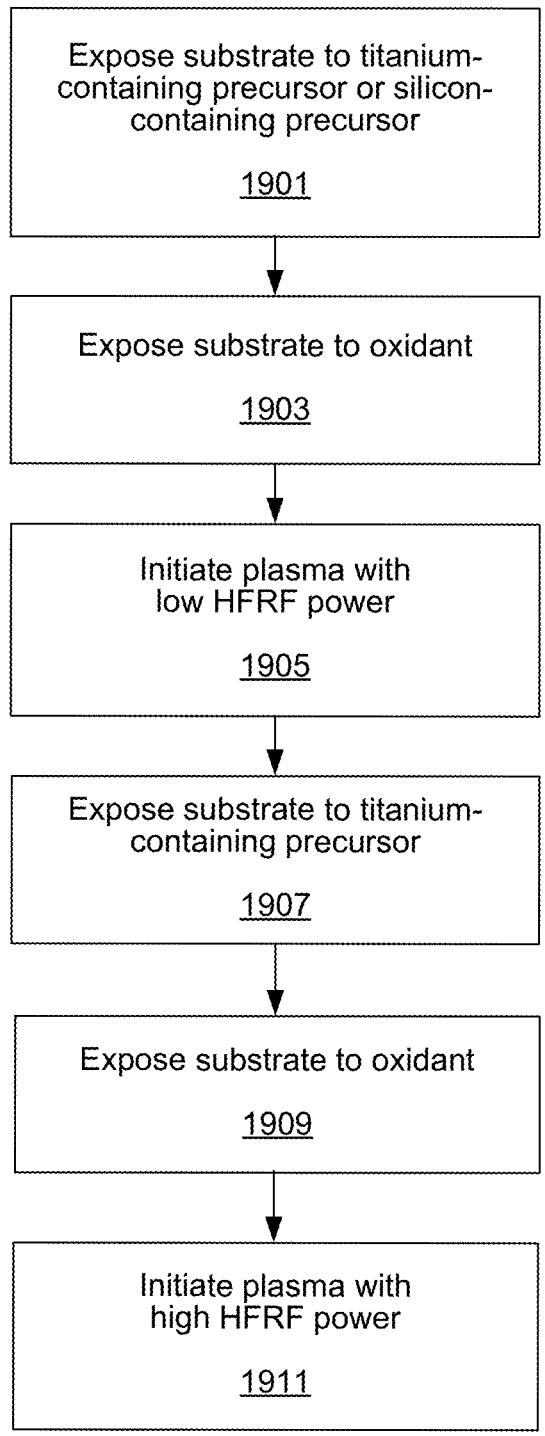
FIG. 19 is a process flow diagram of a method in accordance with disclosed embodiments.

FIG. 19 is a process flow diagram of steps of a method in accordance with various embodiments. Cycle and exposure times described herein may depend on the apparatus and platform used and one of ordinary skill in the art may adjust cycle and exposure times accordingly. In operation 1901, a substrate may be exposed to a first precursor, such as a titanium-containing precursor or silicon-containing precursor. In some embodiments, the substrate includes a core layer. In various embodiments, the core layer is amorphous carbon, amorphous silicon, or a photoresist. In some embodiments, the core layer is lithographically defined or patterned. In a certain embodiment, the substrate includes a patterned amorphous carbon layer.

Examples of a titanium-containing precursor include tetrakis(dimethylamino)titanium (TDMAT), tetraethoxytitanium, tetrakis-dimethyl-amido titanium, titanium isopropoxide, titanium tetraisopropoxide, and titanium tetrachloride. A silicon-containing precursor may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, tetra-ethyl-ortho-silicate (also known as tetra-ethoxy-silane or TEOS) and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane (Cl-$SiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, SiHCl—$(N(CH_3)_2)_2$, $(Si(CH_3)_2NH)_3$ and the like. A further example of an aminosilane is trisilylamine ($N(SiH_3)_3$).

After operation 1901, the deposition chamber may be purged in a sweep phase with an injector purge or a pump away step. Generally, a sweep phase removes or purges one of the vapor phase reactant from a reaction chamber and typically occurs only after delivery of such reactant is completed. In other words, that reactant is no longer delivered to the reaction chamber during the sweep phase. However, the reactant remains adsorbed on the substrate surface during the sweep phase. Typically, the sweep serves to remove any residual vapor phase reactant in the chamber after the reactant is adsorbed on the substrate surface to the desired level. A sweep phase may also remove weakly adsorbed species (e.g., certain precursor ligands or reaction by-products) from the substrate surface. In ALD, the sweep phase has been viewed as necessary to prevent gas phase interaction of two reactants or interaction of one reactant with a thermal, plasma or other driving force for the surface reaction. In general, and unless otherwise specified herein, a sweep/purge phase may be accomplished by (i) evacuating a reaction chamber, and/or (ii) flowing gas not containing the species to be swept out through the reaction chamber. In the case of (ii), such gas may be, for example, an inert gas.

In operation 1903, the substrate may be exposed to a second precursor or an oxidant. In some embodiments, the oxidant is nitrous oxide ($N_2O$) or oxygen ($O_2$) or carbon dioxide ($CO_2$) or a mixture or combinations thereof. In some embodiments, the oxidizer may be a mixture of oxygen ($O_2$) and a weak oxidizer such as $N_2O$, CO, $CO_2$, NO, $NO_2$, SO, $SO_2$, $C_xH_yO_z$ and/or $H_2O$. In other implementations, the oxidation reactant may be entirely a weak oxidizer. Alternatively, the oxidation reactant may include $O_3$. In some embodiments, the oxidation reactant is about 0-50% $O_2$ and about 50-100% weak oxidizer.

In some cases, one of the reactants may be delivered continuously (e.g., even during delivery of other reactants and/or during plasma exposure). For example, an oxidizing reactant may be delivered continuously. The continuously flowing reactant may be delivered to the reaction chamber in conjunction with a carrier gas such as argon. In some cases, the delivery of the continuously flowing reactants to reaction chamber is controlled by using divert valve/inlet valve toggling. Gas flow changes may be diverted or co-flowed. In one example, a continuously flowing reactant is periodically diverted from the reaction chamber such that it is only delivered to the reaction chamber at certain periods. The continuously flowing gas may be diverted to an outlet/dump using appropriate valves. For instance, an oxidizing reactant may flow continuously, but only be delivered to the reaction chamber periodically. When the oxidizing reactant is not being delivered to the reaction chamber, it may be diverted to an outlet, recycle system, etc.

In operation 1905, a plasma may be initiated with a low HFRF power while the substrate is exposed to the oxidant. In some embodiments, the low HFRF power per area of the wafer may be between about $1.768 \times 10^{-4}$ W per mm$^2$ and about $1.768 \times 10^{-3}$ W per mm$^2$ where mm$^2$ represents the unit for surface area of the wafer. Plasma power may be scaled linearly with wafer surface area. For example, a low HFRF power may be between about 12.5 W to about 125 W per station for a 300 mm wafer, or between about 28 W and about 280 W for a 450 mm wafer. The deposition temperature may be between about 50° C. and about 150° C. After operation 1905, the deposition chamber may be purged again. These steps may be repeated until the desired thickness of the film is deposited.

In some embodiments, operation 1905 may occur at a low temperature, such as a temperature less than about 100° C. with an HFRF power while exposing a 300 mm substrate to the oxidant between about 50 W and about 500 W in a four-station tool, the power being the total power applied to the four-station tool.

In operation 1907, the substrate may be exposed to a titanium-containing precursor. Examples of titanium-containing precursors may be any of those described with respect to operation 1901. As an example, the substrate may be exposed to TDMAT for about 2 seconds, which may be described as a "dose." After operation 1907, the deposition chamber may be purged with an injector purge or pump away step. As an example, the purge may last about 10 seconds.

In operation 1909, the substrate may be exposed to another precursor or an oxidant. In many embodiments, the oxidant is nitrous oxide ($N_2O$) or oxygen ($O_2$) or carbon dioxide ($CO_2$) or a mixture thereof. As an example, operation 1909 may be about 30 seconds, such that for the first 25 seconds, no oxidant is flowed and only a carrier gas or inert gas is flowed, and an oxidant is flowed starting after the 25 seconds and is kept on through the next operation. Examples of carrier gases include argon (Ar) and nitrogen ($N_2$). The flow rate of these carrier gases may be between about 0 sccm and about 10,000 sccm.

In operation 1911, a plasma may be initiated with high HFRF power while the substrate is exposed to the oxidant. In many embodiments, the HFRF power may be between about 125 W and about 1500 W per station for 300 mm wafers. As an example, HFRF power may be about 625 W per station. The plasma may be initiated for a time between about 0.25 seconds and about 3 seconds, or about 0.5 seconds. Operations 1907 through 1911 may occur at a temperature between about 50° C. and about 400° C., or between about 50° C. and 200° C., or about 150° C. and at a pressure between about 3 Torr and about 3.5 Torr. After operation 1911, the plasma may be turned off and the chamber may be purged or pumped to base. Example purge gases for use after operations 1901, 1903, 1905, 1907, 1909, and 1911 may be argon (Ar) or nitrogen ($N_2$) or any other suitable purge gas. In some embodiments, the density of the film deposited in operations 1901 through 1905 may be less dense than the film deposited in operations 1907 through 1911.

According to various embodiments, operations 1901 through 1905 may be performed at a lower temperature, and/or lower RF power, and/or shorter RF time, and/or lower pressure, and/or with a weaker oxidant than operations 1907 through 1911. These deposition conditions may help prevent damage to the underlying substrate while producing an operable device.

Figure 20A:
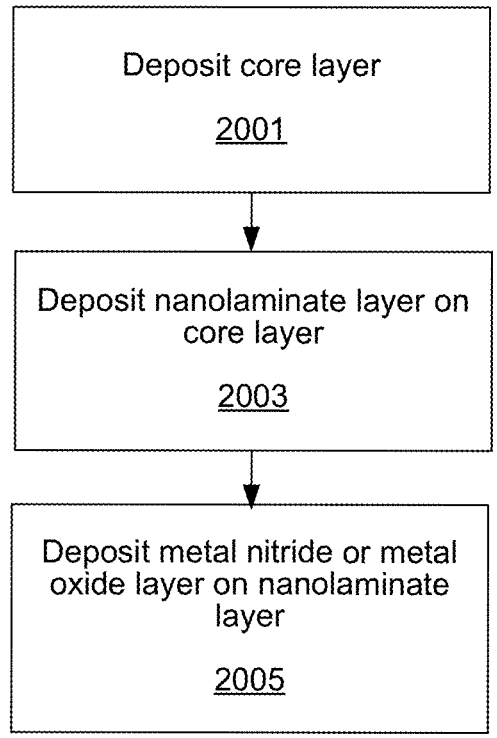
FIGS. 20A and 20B are process flow diagrams of methods in accordance with disclosed embodiments.

FIG. 20A provides a process flow diagram of a method of using nanolaminate layers in accordance with various embodiments. In operation 2001, a core layer may be deposited, such as those described with respect to FIG. 1. The core layer may be an amorphous carbon layer, or amorphous silicon layer, or may be a photoresist. In some embodiments, the core layer is patterned. In operation 2003, a nanolaminate layer is deposited on the core layer. The nanolaminate layer may be deposited by CFD or PEALD methods. The nanolaminate layer may be deposited using operations 1901-1905 with respect to FIG. 19 above. In some embodiments the nanolaminate layer may be silicon oxide ($SiO_2$) or titanium oxide ($TiO_2$). The thickness of the deposited nanolaminate layer may be between about 15 Å and about 200 Å, or between about 15 Å and about 100 Å. In operation 2005, a metal nitride or metal oxide layer may be deposited on the nanolaminate layer. The metal nitride or metal oxide layer may be deposited using operations 1907 through operation 1911 with respect to FIG. 19 above. In some embodiments, the metal nitride or metal oxide layer is a silicon oxide or titanium oxide layer. In some embodiments, the metal nitride or metal oxide layer is a high quality titanium oxide layer. In various embodiments, the metal nitride or metal oxide layer has a high etch selectivity to the core. In many embodiments, the metal nitride or metal oxide layer is denser than the nanolaminate layer.

Figure 20B:
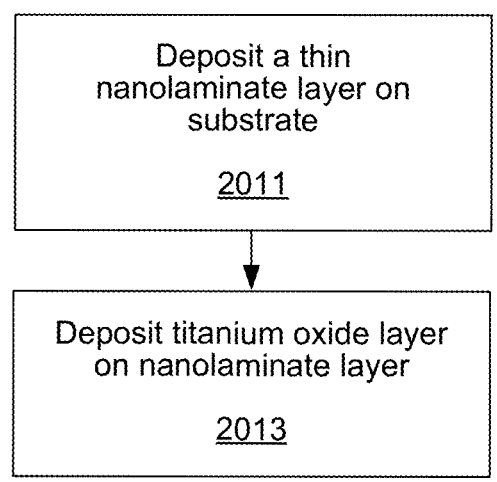

FIG. 20B is a process flow diagram of an example of a method of using a nanolaminate layer in accordance with various embodiments. In operation 2011, a thin nanolaminate layer is deposited on a substrate. A nanolaminate layer may be any of those discussed above with respect to FIGS. 13 and 20A. The nanolaminate layer may be deposited using operations 1901-1905 with respect to FIG. 19 above. In operation 2013, a titanium oxide layer may be deposited on the nanolaminate layer. An example of a titanium oxide layer deposited on a nanolaminate layer is described above with respect to FIG. 14. The titanium oxide layer may be deposited using operations 1907 through operation 1911 with respect to FIG. 19 above.

Apparatus

Deposition techniques provided herein may be implemented in a plasma enhanced chemical vapor deposition (PECVD) reactor or a conformal film deposition (CFD) reactor. Such a reactor may take many forms, and may be part of an apparatus that includes one or more chambers or "reactors" (sometimes including multiple stations) that may each house one or more wafers and may be configured to perform various wafer processing operations. The one or more chambers may maintain the wafer in a defined position or positions (with or without motion within that position, e.g., rotation, vibration, or other agitation). In one implementation, a wafer undergoing film deposition may be transferred from one station to another within a reactor chamber during the process. In other implementations, the wafer may be transferred from chamber to chamber within the apparatus to perform different operations, such as etching operations or lithography operations. The full film deposition may occur entirely at a single station or any fraction of the total film thickness for any deposition step. While in process, each wafer may be held in place by a pedestal, wafer chuck, and/or other wafer-holding apparatus. For certain operations in which the wafer is to be heated, the apparatus may include a heater, such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

Figure 21:
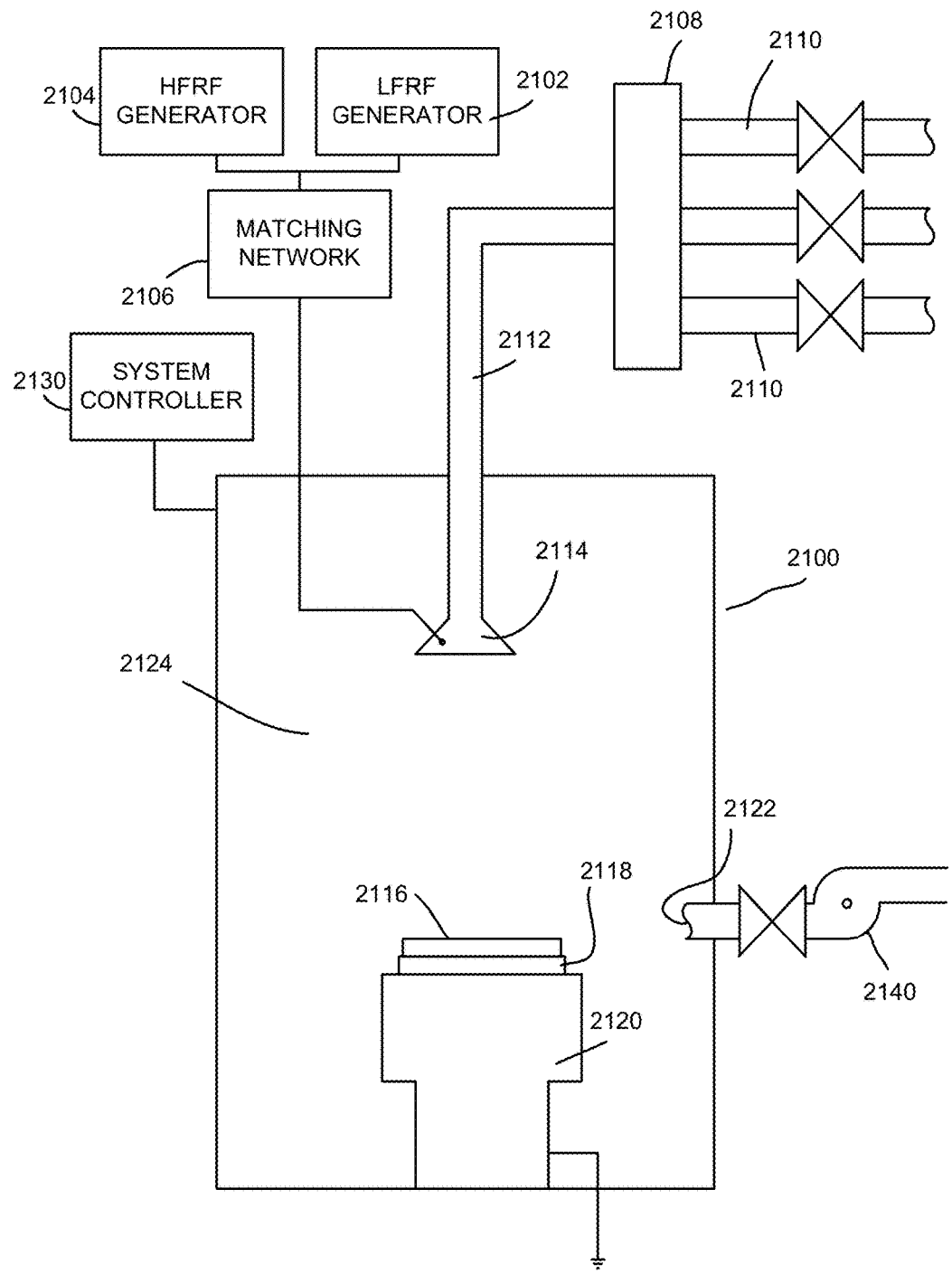
FIG. 21 is an illustration of a reaction chamber for practicing methods in accordance with disclosed embodiments.

FIG. 21 provides a simple block diagram depicting various reactor components arranged for implementing methods described herein. As shown, a reactor 2100 includes a process chamber 2124 that encloses other components of the reactor and serves to contain a plasma generated by a capacitive-discharge type system including a showerhead 2114 working in conjunction with a grounded heater block 2120. A high frequency (HF) radio frequency (RF) generator 2104 and a low frequency (LF) RF generator 2102 may be connected to a matching network 2106 and to the showerhead 2114. The power and frequency supplied by matching network 2106 may be sufficient to generate a plasma from process gases supplied to the process chamber 2124. For example, the matching network 2106 may provide 50 W to 500 W of HFRF power. In some examples, the matching network 2106 may provide 100 W to 5000 W of HFRF power and 100 W to 5000 W of LFRF power total energy. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 2118 may support a substrate 2116. The wafer pedestal 2118 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 2112. Multiple source gas lines 2110 are connected to manifold 2108. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 2124 via an outlet 2122. A vacuum pump, e.g., a one or two stage mechanical dry pump and/or turbomolecular pump 2140, may be used to draw process gases out of the process chamber 2124 and to maintain a suitably low pressure within the process chamber 2124 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching steps if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 2130 having instructions for controlling process operations in accordance with the disclosed embodiments. The system controller 2130 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments, e.g., a technique such as that provided in the deposition steps of FIG. 19. Machine-readable media containing instructions for controlling process operations in accordance with the present disclosure may be coupled to the system controller 2130. The controller 2130 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 2130 may control all of the activities of the reactor 2100. The system controller 2130 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 2100. The system control software may be configured in any suitable way. For example, various process tool component subroutines or control objects may be written to control operation of the process tool components necessary to carry out various process tool processes. The system control software may be coded in any suitable computer readable programming language.

The system controller 2130 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 2130.

The method and apparatus described herein may be used in conjunction with lithographic patterning tools or processes such as those described below for fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step performed with a number of possible tools: (1) application of photoresist on a workpiece, i.e., substrate or multi-layer stack as provided in disclosed embodiments, using a spin-on or spray-on tool; (2) curing a photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferred the resist pattern into an underlying film or workpiece, such as an amorphous carbon layer, by using a dry or plasma-assisted etching tool such as those described below; and (6) removing the resist using a tool such as an RF or microwave plasma resist stripper. In one implementation, one or more gap features on a wafer are filled with a carbon film using a technique as described herein. The carbon film may then be used, for example, for one of the purposes described herein. Further the implementation may include one or more of steps (1) through (6) described above.

Figure 22:
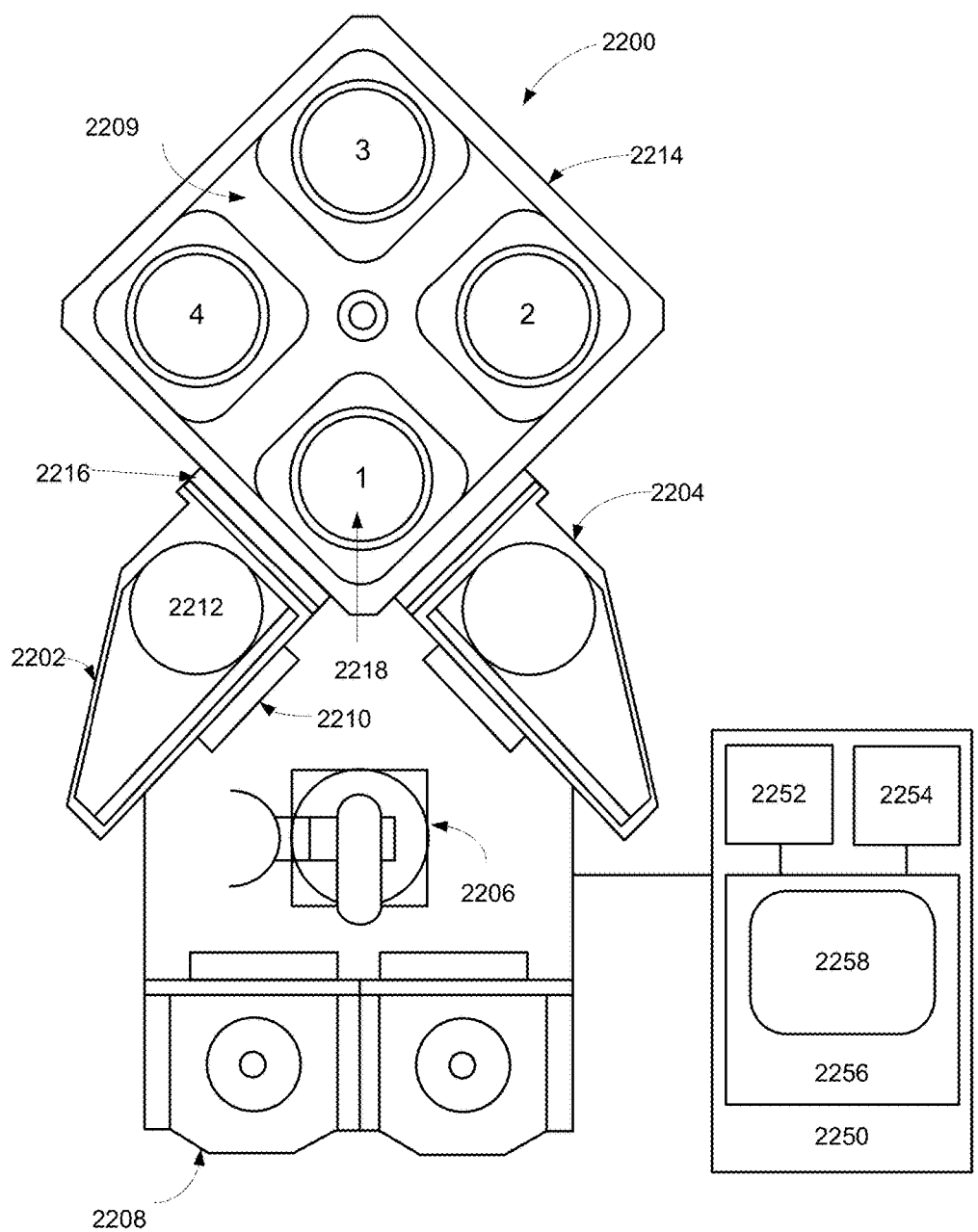
FIG. 22 is an illustration of a multi-station apparatus that may be used for performing operations in accordance with disclosed embodiments.

One or more process stations may be included in a multi-station processing tool. FIG. 22 shows a schematic view of an embodiment of a multi-station processing tool 2200 with an inbound load lock 2202 and an outbound load lock 2204, either or both of which may include a remote plasma source. A robot 2206, at atmospheric pressure, is configured to move wafers from a cassette loaded through a pod 2208 into inbound load lock 2202 via an atmospheric port 2210. A wafer is placed by the robot 2206 on a pedestal 2212 in the inbound load lock 2202, the atmospheric port 2210 is closed, and the load lock is pumped down. Where the inbound load lock 2202 includes a remote plasma source, the wafer may be exposed to a remote plasma treatment in the load lock prior to being introduced into a processing chamber 2214. Further, the wafer also may be heated in the inbound load lock 2202 as well, for example, to remove moisture and adsorbed gases. Next, a chamber transport port 2216 to processing chamber 2214 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 2214 includes four process stations, numbered from 1 to 4 in the embodiment shown in FIG. 22. Each station has a heated pedestal (shown at 2218 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 2214 may include one or more matched pairs of CFD and PECVD process stations. While the depicted processing chamber 2214 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 22 also depicts an embodiment of a wafer handling system 2290 for transferring wafers within processing chamber 2214. In some embodiments, wafer handling system 2290 may transfer wafers between various process stations and/or between a process station and a load lock. It will be appreciated that any suitable wafer handling system may be employed. Non-limiting examples include wafer carousels and wafer handling robots. FIG. 22 also depicts an embodiment of a system controller 2250 employed to control process conditions and hardware states of process tool 2200. System controller 2250 may include one or more memory devices 2256, one or more mass storage devices 2254, and one or more processors 2252. Processor 2252 may include a CPU or computer, analog and/or digital input/output connections, stepper motor controller boards, etc.

In some embodiments, system controller 2250 controls all of the activities of process tool 2200. System controller 2250 executes system control software 2258 stored in mass storage device 2254, loaded into memory device 2256, and executed on processor 2252. Alternatively, the control logic may be hard coded in the controller 2250. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 2258 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 2200. System control software 2258 may be configured in any suitable way. For example, various process tool component subroutines or control objects may be written to control operation of the process tool components necessary to carry out various process tool processes. System control software 2258 may be coded in any suitable computer readable programming language.

In some embodiments, system control software 2258 may include input/output control (IOC) sequencing instructions for controlling the various parameters described above. For example, each phase of a CFD process may include one or more instructions for execution by system controller 2250. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 2254 and/or memory device 2256 associated with system controller 2250 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2218 and to control the spacing between the substrate and other parts of process tool 2200.

A process gas control program may include code for controlling gas composition and flow rates and optionally for flowing gas into one or more process stations prior to deposition in order to stabilize the pressure in the process station. In some embodiments, the controller includes instructions for depositing a nanolaminate protective layer on a core layer, and depositing a conformal layer over the protective layer.

A pressure control program may include code for controlling the pressure in the process station by regulating, for example, a throttle valve in the exhaust system of the process station, a gas flow into the process station, etc. In some embodiments, the controller includes instructions for depositing a nanolaminate protective layer on a core layer, and depositing a conformal layer over the protective layer.

A heater control program may include code for controlling the current to a heating unit that is used to heat the substrate. Alternatively, the heater control program may control delivery of a heat transfer gas (such as helium) to the substrate. In certain implementations, the controller includes instructions for depositing a nanolaminate protective layer at a first temperature, and a conformal layer over the protective layer at a second temperature, where the second temperature is higher than the first temperature.

A plasma control program may include code for setting RF power levels and exposure times in one or more process stations in accordance with the embodiments herein. In some embodiments, the controller includes instructions for depositing a nanolaminate protective layer at a first RF power level and RF duration, and depositing a conformal layer over the protective layer at a second RF power level and RF duration. The second RF power level and/or the second RF duration may be higher/longer than the first RF power level/duration.

In some embodiments, there may be a user interface associated with system controller 2250. The user interface may include a display screen, graphical software displays of the apparatus and/or process conditions, and user input devices such as pointing devices, keyboards, touch screens, microphones, etc.

In some embodiments, parameters adjusted by system controller 2250 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 2250 from various process tool sensors. The signals for controlling the process may be output on the analog and digital output connections of process tool 2200. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2250 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

EXPERIMENTAL

Experiment 1

Figure 23A:
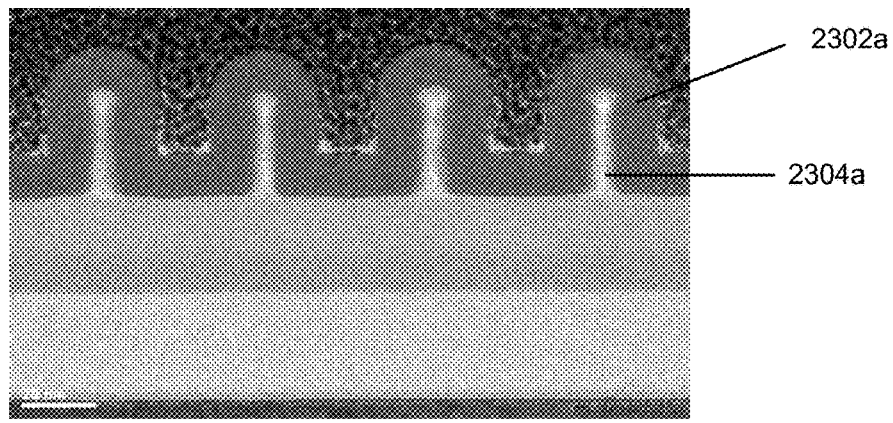
FIGS. 23A-23C are images of deposited films from experiments in performing methods in accordance with disclosed embodiments.

Experiments were conducted to compare deposited spacer or conformal films on unprotected cores and those deposited on cores protected by a nanolaminate protective layer. In the first trial, a substrate with a patterned core layer made of amorphous carbon was provided. High quality titanium oxide was deposited directly on the core layer by a plasma enhanced atomic layer deposition (PEALD) or conformal film deposition (CFD) method. The chamber pressure was about 3 Torr and at a temperature about 150° C. The substrate was exposed to the first precursor, TDMAT, for 2 seconds, followed by a 10 second purge. The substrate was then exposed to a mixture of oxidants $N_2O/O_2$ in a 30 second exposure where the first 25 seconds involved flowing only the carrier gas $N_2$ (at a flow rate of up to 9500 sccm) and in the last five seconds, the $N_2O/O_2$ flow was turned on and stayed on until the plasma was initiated for 0.5 seconds. The plasma was initiated with a high frequency radio frequency (HFRF) power of 625 W per station, or 2500 W for four stations. The $N_2O/O_2$ flow and plasma were turned off at the same time after the 0.5 second plasma exposure, and lastly the chamber was pumped to base to purge the chamber. An image of the deposited conformal film and the underlying core layer is shown in FIG. 23A. The degraded core layer 2304a is shown underneath the titanium oxide ($TiO_2$) conformal film layer 2302a.

Figure 23B:
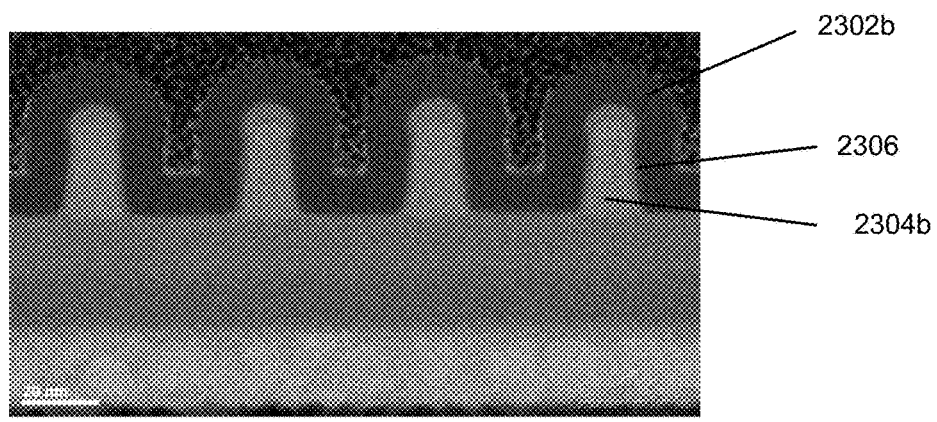

In the second trial, a substrate with a patterned core layer made of amorphous carbon was also provided. A silicon oxide ($SiO_2$) nanolaminate protective layer was deposited on the core layer by PEALD. Deposition chamber temperature was 50° C. and pressure of the chamber was 1.8 Torr. The substrate was exposed to a silicon-containing precursor 0.2 seconds, followed by a 0.2 second purge. The substrate was then exposed to a mixture of oxidants $N_2O/O_2$ in a 0.3 second exposure. A plasma was initiated for the four-station chamber at 1000 W, or about 500 W per station. The $N_2O/O_2$ flow and plasma were turned off and the chamber was purged. Subsequently, the substrate was exposed to TDMAT for 2 seconds, followed by a 10 second purge. Following the purge, the substrate was exposed to oxidants $N_2O/O_2$ in a 30 second exposure such that the mixture flowed only in the last 5 seconds and after the 30 seconds, continued to flow for 0.5 seconds while plasma was initiated for the 0.5 seconds at 625 W per station, or 2500 W for four stations. After both the plasma and the oxidants $N_2O/O_2$ flow were turned off, the chamber was again purged. An image of the deposited conformal film, nanolaminate layer, and underlying core layer is shown in FIG. 23B. As shown, the deposited conformal film 2302b was deposited on top of a nanolaminate layer 2306 which is so thin that it is indistinguishable from the conformal film and core layer it is adjacent to. Note that compared to FIG. 23A, the core mandrels 2304b have very little degradation or consumption.

Figure 23C:
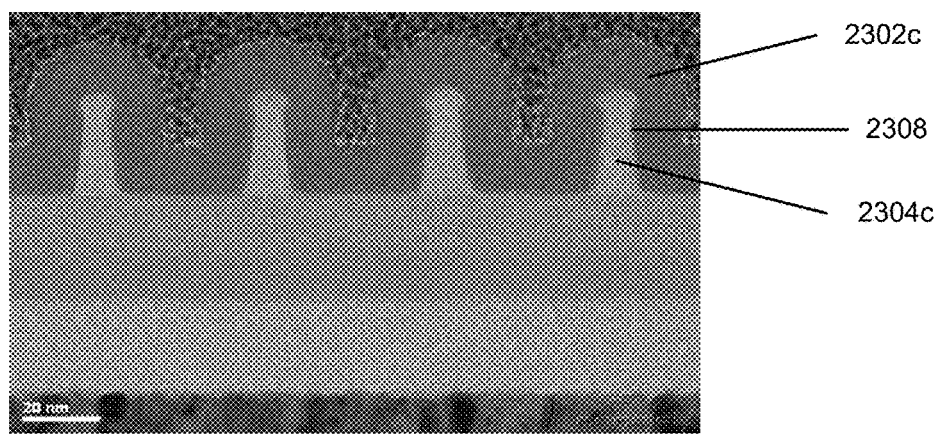

In the third trial, a substrate with a patterned core layer made of amorphous carbon was also provided. A titanium oxide ($TiO_2$) nanolaminate protective layer was deposited on the core layer by PEALD. Deposition chamber temperature was 150° C. and pressure of the chamber was 3.0 Torr. The substrate was exposed to TDMAT for 2 seconds, followed by a 10 second purge. The substrate was then exposed to a mixture of oxidants $N_2O/O_2$ in a 30 second exposure such that the mixture flowed only in the last 5 seconds and after the 30 seconds, continued to flow for 0.5 seconds while a plasma was initiated for the four-station chamber at 1000 W, or about 500 W per station. The $N_2O/O_2$ flow and plasma were turned off and the chamber was purged. Subsequently, the substrate was exposed to TDMAT for 2 seconds, followed by a 10 second purge. Following the purge, the substrate was exposed to oxidants $N_2O/O_2$ in a 30 second exposure such that the mixture flowed only in the last 5 seconds and after the 30 seconds, continued to flow for 0.5 seconds while plasma was initiated for the 0.5 seconds at 625 W per station, or 2500 W for four stations. After both the plasma and the oxidants $N_2O/O_2$ flow were turned off, the chamber was again purged. An image of the deposited conformal film, nanolaminate layer, and underlying core layer is shown in FIG. 23C. As shown, the deposited conformal film 2302c was deposited on top of a nanolaminate layer 2308 which is so also thin that it is indistinguishable from the conformal film and core layer it is adjacent to. Note that the core mandrels 2304c have very little degradation or consumption.

Experiment 2

Another series of experiments were conducted using the same conditions as those described with respect to the three trials above, but for blanket substrates with no features. In each trial, the thickness of the amorphous carbon layer was measured, then the spacer was deposited and the spacer thickness was measured, and lastly the thickness of the remaining amorphous carbon layer after spacer deposition was measured. The carbon consumption was calculated by subtracting the thickness after spacer deposition from the thickness before spacer deposition. The results of this series of experiments are shown in Table 1.

TABLE 1

| Carbon Consumption and Nanolaminate Layers | | | | |
| --- | --- | --- | --- | --- |
| | | Trial 1 | Trial 2 | Trial 3 |
| Nanolaminate | Composition | None | $SiO_2$ | $TiO_2$ |
| | Deposition Power | | 500 W | 500 W |
| | Deposition Temperature | | 50° C. | 150° C. |
| | Thickness Deposited (TEM) | | 1.44 nm | |
| Spacer | Thickness Deposited (TEM) | 5.9 nm | | 4.7 nm |
| Amorphous Carbon | Thickness Before Spacer Deposition | 43.886 nm | 44.1 nm | 45.0 nm |
| | Thickness After Spacer Deposition | 28.36 nm | 35.3 nm | 36.4 nm |
| | Carbon Consumption | 15.4 nm | 8 nm | 8.6 nm |

As shown in the table, presence of the nanolaminate layer reduced carbon consumption substantially. Without the nanolaminate layer, carbon consumption was 15.4 nm, whereas for both the $SiO_2$ and $TiO_2$ nanolaminate layers, carbon consumption was only about 8 nm. Thus, depositing a nanolaminate layer over an amorphous carbon layer, particularly patterned amorphous carbon layer, protects the amorphous carbon layer when the spacer is deposited and higher quality films may be deposited for spacer deposition as a result.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of processing a substrate, the method comprising:
   depositing a core layer;
   depositing a nanolaminate layer on the core layer; and
   depositing a metal nitride or metal oxide layer on the nanolaminate layer,
   wherein the nanolaminate layer comprises a stack comprising two or more sublayers, and
   wherein the nanolaminate layer comprises silicon oxide or titanium oxide.

2. The method of claim 1, wherein the core layer is a patterned layer.

3. The method of claim 1, wherein the core layer comprises amorphous carbon or a photoresist.

4. The method of claim 1, wherein each of the more than one layer of the nanolaminate layer is deposited using plasma enhanced atomic layer deposition (PEALD) by:
   exposing the substrate to a titanium-containing precursor or a silicon-containing precursor;
   exposing the substrate to an oxidant; and
   initiating a plasma while the substrate is exposed to the oxidant.

5. The method of claim 1, wherein the metal nitride or metal oxide layer comprises titanium oxide or silicon oxide.

6. The method of claim 1, wherein the metal nitride or metal oxide layer has etch selectivity to the core layer.

7. The method of claim 1, wherein the each of the two or more sublayers of the nanolaminate layer comprises silicon oxide or titanium oxide.

8. A method of processing a substrate, the method comprising:
   depositing a core layer;
   depositing a nanolaminate layer on the core layer; and
   depositing a metal nitride or metal oxide layer on the nanolaminate layer,
   wherein the metal nitride or metal oxide layer is deposited using a metal-containing precursor by plasma enhance atomic layer deposition (PEALD),
   wherein the nanolaminate layer comprises a stack comprising two or more sublayers.

9. The method of claim 8, wherein the metal-containing precursor is a titanium-containing precursor or a silicon-containing precursor and the PEALD is performed by exposing the substrate to the titanium-containing precursor or the silicon-containing precursor;
   exposing the substrate to an oxidant; and
   initiating a plasma while the substrate is exposed to the oxidant.

10. The method of claim 9, wherein the nanolaminate layer is deposited at a temperature between about 50° C. and about 150° C. and the plasma is initiated with HFRF power per square millimeter of substrate area between about $1.768 \times 10^{-4}$ W per $mm^2$ and about $1.768 \times 10^{-3}$ W per $mm^2$.

11. The method of claim 9, wherein the nanolaminate layer is deposited at a temperature less than about 100° C.

12. The method of claim 8, wherein the metal nitride or metal oxide layer deposited using the metal-containing precursor by PEALD is performed by exposing the substrate to the metal-containing precursor; exposing the substrate to an oxidant; and initiating a plasma while the substrate is exposed to the oxidant at a HFRF power per square millimeter of substrate area of at least about $1.768 \times 10^{-3}$ W per $mm^2$.

13. The method of claim 8, wherein the two or more sublayers have different compositions.

14. A method of patterning a semiconductor substrate, the method comprising:
    prior to depositing a conformal film on a core layer, depositing a nanolaminate protective layer on a patterned core layer;
    depositing a conformal film on the nanolaminate protective layer;
    planarizing the conformal film to expose the patterned core layer; and
    selectively etching the patterned core layer to form a mask.

15. The method of claim 14, wherein the patterned core layer comprises amorphous carbon.

16. The method of claim 14, wherein the nanolaminate protective layer comprises silicon oxide or titanium oxide.

17. The method of claim 14, wherein the nanolaminate protective layer is deposited using plasma enhanced atomic layer deposition (PEALD) by exposing the semiconductor substrate to a titanium-containing precursor or a silicon-containing precursor; exposing the semiconductor substrate to an oxidant; and initiating a first plasma while the semiconductor substrate is exposed to the oxidant.

18. The method of claim 17, wherein the nanolaminate protective layer is deposited at a temperature less than about 100° C.

19. The method of claim 17, wherein the nanolaminate protective layer is deposited at a temperature between about 50° C. and about 150° C. and the first plasma is initiated at a HFRF power per square millimeter of substrate area between about $1.768 \times 10$-4 per $mm^2$ and about $1.768 \times 10$-3 per $mm^2$.

20. The method of claim 17, wherein the conformal film is deposited using PEALD by exposing the semiconductor substrate to a titanium-containing precursor; exposing the semiconductor substrate to an oxidant; and initiating a second plasma while the semiconductor substrate is exposed to the oxidant at a HFRF power per square millimeter of substrate area of at least about $1.768 \times 10^{-3}$ W per mm2.

\* \* \* \* \*